United States Patent
Luan et al.

(10) Patent No.: US 10,256,241 B2
(45) Date of Patent: Apr. 9, 2019

(54) VERTICAL THYRISTOR MEMORY WITH MINORITY CARRIER LIFETIME REDUCTION

(71) Applicant: TC Lab, Inc., Gilroy, CA (US)

(72) Inventors: Harry Luan, Saratoga, CA (US); Valery Axelrad, Woodside, CA (US); Charlie Cheng, Los Altos, CA (US)

(73) Assignee: TC Lab, Inc., Gilroy, CA (US)

( * ) Notice: Subject to any disclaimer, the term of this patent is extended or adjusted under 35 U.S.C. 154(b) by 0 days.

(21) Appl. No.: 15/426,972

(22) Filed: Feb. 7, 2017

(65) Prior Publication Data

US 2017/0229306 A1     Aug. 10, 2017

Related U.S. Application Data

(60) Provisional application No. 62/300,015, filed on Feb. 25, 2016, provisional application No. 62/294,270, (Continued)

(51) Int. Cl.
| | |
|---|---|
| *H01L 29/74* | (2006.01) |
| *H01L 31/111* | (2006.01) |
| *H01L 27/102* | (2006.01) |
| *H01L 21/285* | (2006.01) |
| *H01L 21/8229* | (2006.01) |

(Continued)

(52) U.S. Cl.
CPC .......... *H01L 27/1027* (2013.01); *G11C 11/39* (2013.01); *H01L 21/02271* (2013.01); *H01L 21/221* (2013.01); *H01L 21/26513* (2013.01); *H01L 21/28518* (2013.01); *H01L 21/28525* (2013.01); *H01L 21/28562* (2013.01); *H01L 21/28568* (2013.01); *H01L 21/32053* (2013.01); *H01L 21/8229* (2013.01); *H01L 23/53209* (2013.01); *H01L 23/53242* (2013.01); *H01L 27/0817* (2013.01); *H01L 27/1023* (2013.01); *H01L 27/10802* (2013.01); *H01L 28/00* (2013.01); *H01L 29/0642* (2013.01); *H01L 29/0649* (2013.01); *H01L 29/0839* (2013.01); *H01L 29/16* (2013.01); *H01L 29/161* (2013.01); *H01L 29/165* (2013.01); *H01L 29/456* (2013.01); *H01L 29/66363* (2013.01); *H01L 29/74* (2013.01); *H01L 29/87* (2013.01)

(58) Field of Classification Search
None
See application file for complete search history.

(56) References Cited

U.S. PATENT DOCUMENTS

| | | | | |
|---|---|---|---|---|
| 9,361,966 | B2 * | 6/2016 | Nemati | ............... H01L 27/0817 |
| 2012/0275215 | A1 * | 11/2012 | Tsukada | .............. H01L 27/1021 365/149 |
| 2017/0372766 | A1 * | 12/2017 | Luan | ................... H01L 27/1027 |

\* cited by examiner

*Primary Examiner* — Thien F Tran
(74) *Attorney, Agent, or Firm* — Aka Chan LLP

(57) ABSTRACT

Apparatus and methods for reducing minority carriers in a memory array are described herein. Minority carriers diffuse between ON cells and OFF cells, causing disturbances during write operation as well as reducing the retention lifetime of the cells. Minority Carrier Lifetime Killer (MCLK) region architectures are described for vertical thyristor memory arrays with insulation trenches. These MCLK regions encourage recombination of minority carriers. In particular, MCLK regions formed by conductors embedded along the cathode line of a thyristor array, as well as dopant MCLK regions are described, as well as methods for manufacturing thyristor memory cells with MCLK regions.

6 Claims, 16 Drawing Sheets

Related U.S. Application Data filed on Feb. 11, 2016, provisional application No. 62/294,239, filed on Feb. 11, 2016, provisional application No. 62/292,547, filed on Feb. 8, 2016.

(51) Int. Cl.
*H01L 23/532* (2006.01)
*H01L 29/45* (2006.01)
*H01L 21/02* (2006.01)
*H01L 21/22* (2006.01)
*H01L 21/3205* (2006.01)
*H01L 27/108* (2006.01)
*H01L 29/06* (2006.01)
*H01L 29/16* (2006.01)
*H01L 29/66* (2006.01)
*H01L 21/265* (2006.01)
*H01L 29/161* (2006.01)
*G11C 11/39* (2006.01)
*H01L 27/08* (2006.01)
*H01L 29/08* (2006.01)
*H01L 29/87* (2006.01)
*H01L 49/02* (2006.01)
*H01L 29/165* (2006.01)

VERTICAL THYRISTOR MEMORY WITH MINORITY CARRIER LIFETIME REDUCTION

CROSS REFERENCE TO RELATED APPLICATIONS

This patent application claims the benefit of U.S. Provisional Patent Application No. 62/294,270, filed Feb. 11, 2016 entitled "Vertical Thyristor Memory Array with Metal Plug Wordlines"; from U.S. Provisional Patent Application No. 62/294,239 filed Feb. 11, 2016 entitled "Vertical Thyristor Memory Cell with Minority Carrier Lifetime Reduction Dopants"; from U.S. Provisional Patent Application No. 62/292,547 filed Feb. 8, 2016 entitled "High Density Vertical Thyristor Memory Cell and Memory Array Using a Heterostructured Cathode"; from U.S. Provisional Patent Application No. 62/300,015 filed Feb. 25, 2016 entitled "Vertical Cross-point Thyristor Memory Cell and Memory Array with Buried Metal Access Lines." Each of these applications is hereby incorporated by reference herein in its entirety.

FIELD OF THE DISCLOSURE

The disclosure described herein relates to semiconductor devices for information storage. The semiconductor devices can be used as volatile memories such as static random access memories (SRAMs) and dynamic random access memories (DRAMs).

BACKGROUND OF THE DISCLOSURE

The 1-transistor/1-capacitor (1T1C) cell has been the predominant memory cell used in DRAM devices for the last 30 years. Bit density has quadrupled every three years by lithographical scaling and ever increasing process complexity. Maintaining a sufficiently high capacitance value and low transistor leakage current has become a major problem for further scaling.

Alternative DRAM cells have been proposed to overcome the scaling challenges of conventional 1T1C DRAM technology. These alternatives DRAM cells are described as follows.

Floating body DRAM (FBDRAM) is a single Metal Oxide Semiconductor Field Effect Transistor (MOSFET) built on either a silicon-on-insulator (SOI) (Okhonin, S., et al. "A SOI capacitor-less 1T-DRAM concept." SOI Conference, 2001 IEEE International. IEEE, 2001.) or in a triple-well with a buried n-implant (Ranica, R., et al. "A one transistor cell on bulk substrate (1T-Bulk) for low-cost and high density eDRAM." VLSI Technology, 2004. Digest of Technical Papers. 2004 Symposium on IEEE, 2004.). The technology has yet to solve its data retention issues, particularly at scaled dimensions.

Various cell designs have been proposed based on the negative differential resistance (NDR) behavior of a pnpn thyristor. An active or passive gate may be used in these designs for trade-offs among switching speed, retention leakage, or operation voltage. The thin capacitively-coupled thyristor (TCCT), as described by U.S. Pat. No. 6,462,359, is a lateral pnpn thyristor constructed on an SOI substrate and has a coupling gate for increased switching speed. Due to its lateral 2D design and the need for a gate, the cell size can be much larger than the 1T1C cell (which is about 6~8F2).

Recently, Liang in U.S. Pat. No. 9,013,918 described a pnpn thyristor cell that is constructed on top of a silicon substrate and operated in a forward and reverse breakdown regime for writing data into the cell. The use of epitaxial or chemical vapor deposition (CVD) processed semiconductor layers at the back end of a standard CMOS process adds on thermal cycles and etch steps that may degrade performance and yield of devices already fabricated on the substrate earlier in a fabrication process (e.g., during front-end processing). In addition, pnpn devices operated in the breakdown regime may pose challenges in process control and also power consumption.

More detailed description of the use of bulk vertical thyristors arranged in cross-point arrays for high density RAM applications can be found in the following applications. U.S. patent application Ser. No. 14/841,140, entitled "Thyristor Volatile Random Access Memory and Methods of Manufacture" filed Aug. 31, 2015, describes a volatile memory array using vertical thyristors, together with methods of fabricating the array, and is incorporated by reference herein in its entirety. U.S. patent application Ser. No. 14/841,521, entitled "Methods of Reading and Writing Data in a Thyristor Random Access Memory" filed Aug. 31, 2015, describes a volatile memory array using vertical thyristors together with methods of operating the array to read data from and write data to the array, and is incorporated by reference herein in its entirety. U.S. patent application Ser. No. 14/841,578, entitled "Methods of Retaining and Refreshing Data in a Thyristor Random Access Memory" filed Aug. 31, 2015, describes a volatile memory array using vertical thyristors together with methods of operating the array to read, write, retain and refresh data stored therein, and is incorporated by reference herein in its entirety. U.S. patent application Ser. No. 14/841,615 entitled "Power Reduction in Thyristor Random Access Memory" filed Aug. 31, 2015, describes a volatile memory array using vertical thyristors together with methods of reducing power consumption in such arrays, and is incorporated by reference herein in its entirety.

As the isolation trenches in thyristor memories become narrower, minority carriers from ON cells can diffuse to neighboring OFF cells. This causes either disturbance of the OFF cells either during write or reduces the retention lifetime. Known solutions include making the trench isolation deeper and/or wider so that these minority carriers can recombine before they reach any OFF cells. The disadvantages with these designs are the required high aspect ratio trench etch and fill in the case of deep isolation and large cell size in the case of a large isolation width. There is a need, therefore, for compact cell and array design that is not only small and reliable but also easy for integration and manufacturing.

SUMMARY

Vertical thyristors arranged in cross-point arrays offer a promising solution to the challenges described in the background of the disclosure. Methods and systems for reducing minority carrier lifetime within a cathode line and thereby reducing electrical disturb effects between thyristor memory cells in a memory array are provided herein.

In some embodiments, a conductor material region may be formed within a trench between a first thyristor (e.g., a first silicon thyristor) and a second thyristor (e.g., a second silicon thyristor). The conductor material region may be located along a pathway of minority carriers between a first cathode of the first thyristor and a second cathode of the second thyristor.

In some embodiments, dopants that reduce a lifetime of minority carriers (e.g., holes in an n-doped region, or electrons in a p-doped region) are implanted within a region below a trench that separates a first thyristor (e.g., a silicon thyristor), and a second thyristor (e.g., a second silicon thyristor). The dopants act as recombination-generation centers which may capture minority carriers and eliminate the minority carriers through recombination.

In some embodiments, an apparatus includes a first silicon thyristor, a second silicon thyristor, a trench formed between the first silicon thyristor and the second silicon thyristor, and a conductor material region (e.g., formed from a conductor material such as a metal, a metal silicide, or any other suitable conductor material) formed in the trench. The first silicon thyristor may include a first anode, a first base, a second base, and a first cathode. The second silicon thyristor may include a second anode, a third base, a fourth base, and a second cathode. The conductor material region formed in the trench may be located along a minority carrier diffusion pathway between the first silicon thyristor and the second silicon thyristor, and may connect the first cathode of the first silicon thyristor and the second cathode of the second silicon thyristor.

In some aspects, the conductor material region connecting the first cathode of the first silicon thyristor and the second cathode of the second silicon thyristor extends into the first cathode, and extends into the second cathode. For example, the conductor material region may be formed into a cavity in a sidewall of a first cathode of the first silicon thyristor. For example, the cavity may be formed by an isotropic etch of the sidewall of the first silicon thyristor.

In some aspects, the conductor material region connecting the first cathode of the first silicon thyristor and the second cathode of the second silicon thyristor contacts a surface of the first cathode without extending into the first cathode and contacts a surface of the second cathode without extending into the second cathode. For example, the conductor material region may be formed by depositing the conductor material into trenches formed by directional anisotropic etching between the first silicon thyristor and second silicon thyristor.

In some aspects, the conductor material region connecting the first cathode of the first silicon thyristor and the second cathode of the second silicon thyristor is electrically coupled to the first cathode through a first metal silicide region, and is electrically coupled to the second cathode through a second metal silicide region. For example, a metal silicide may be formed by reacting an exposed sidewall of a first cathode of a first silicon thyristor to form a first metal silicide region, and an exposed sidewall of a second cathode of a second silicon thyristor to form a second metal silicide region.

In some aspects, the first metal silicide region and the second metal silicide region include metal components which are not part of a composition of the conductor material region. For example, the metal silicide may be formed by reacting a first metal of a first type (e.g., cobalt, titanium, nickel, or any other suitable metal) with the sidewalls of the first thyristor and second thyristor. The first metal may be subsequently removed, or may be fully reacted with the sidewalls of the first thyristor and second thyristor. A second metal of a second type (e.g., tungsten) may be deposited within the trench to electrically connect the first metal silicide region with the second metal silicide region.

In some aspects, the first metal silicide and the second metal silicide may be formed from a same metal as the metal conductor region. For example, a first metal (e.g., tungsten) may be deposited within the trench, in contact with a first sidewall of the first silicon thyristor and in contact with a second sidewall of the second silicon thyristor. The tungsten may be reacted with the first sidewall to form a first metal silicide region (e.g., tungsten silicide region), and reacted with the second sidewall to form a second metal silicide region (e.g., tungsten silicide region), connected by tungsten metal.

In some aspects, the first metal silicide region and the second metal silicide region are physically connected. For example, metal (e.g., cobalt, titanium, nickel or any other suitable metal) may be deposited into trenches proximate to a first thyristor such that a first portion of the metal is in contact with a first sidewall of a first thyristor (e.g., at a first cathode of the first thyristor), and a second portion of the metal is in contact with a second sidewall of the first thyristor (e.g., at the first cathode of the first thyristor). The first portion of the metal and the second portion of the metal may be reacted to fully silicide the first cathode from the first sidewall of the first cathode and from the second sidewall of the first cathode.

In some aspects, the conductor material region is formed at a base of the trench. For example, the conductor material region may be formed by depositing a metal (e.g., Tungsten or any other suitable metal) at the base of the trench after performing an etch to form the trench. The metal may be deposited before or after forming a liner oxide along the etched trench. In some embodiments, the metal may be deposited, followed by a subsequent liner oxidation to remove damage to silicon along sidewalls of the trench.

In some aspects, the conductor material region is separated from a base of the trench by a layer of insulating material. For example, a layer of insulating material (e.g., silicon oxide) may be formed in the trench and then etched back before forming the conductor material region.

In some aspects, the conductor material region is formed by a chemical vapor deposition process. A conformal deposition process such as a chemical vapor deposition (CVD) process may be useful to form material within a trench in cases where there is a cavity into a sidewall of a first cathode of a first thyristor, or an undercut into the first cathode. In some aspects, the conductor material region includes Tungsten.

In some embodiments, an apparatus includes a first silicon thyristor, a second silicon thyristor, a trench between the first silicon thyristor and the second silicon thyristor, and a semiconductor region formed below a base of the trench, the semiconductor region including a dopant type that reduces a minority carrier lifetime.

In some aspects, the dopant type includes at least one of iron (Fe), Pt (Platinum), Argon (Ar) or Helium (He). Other dopants that have d-orbital states that are within the bandgap of silicon may also be suitable dopant types for reducing lifetime of minority carriers in silicon.

In some aspects, the apparatus further includes a cathode line connecting the first cathode and the second cathode, where the cathode line is doped by the dopant type that reduces the minority carrier lifetime. For example, instead of forming or implanting the dopants that reduce a minority carrier lifetime within trenches between a first silicon thyristor and a second silicon thyristor, the dopants that reduce a minority carrier lifetime may be formed or implanted along the cathode line.

In some aspects, parts of the first silicon thyristor and parts of the second silicon thyristor may be formed by one or more epitaxial processes. For example, a first anode of the first silicon thyristor and a second anode of the second silicon thyristor are formed by a first epitaxial process where a first base of the first silicon thyristor and a second base of the second silicon thyristor are formed by a second epitaxial process. For example, the first silicon thyristor may include a first anode, a first base, a third base and a first cathode and the second silicon thyristor may include a second anode a second base, a fourth base, and a second cathode. The third base and the fourth base may be formed from a same layer that was formed by an epitaxial process. The first base and the third base may be formed from a same layer that was formed by an epitaxial process. The first anode and the second anode may be formed form a same layer that was formed by an epitaxial process. The forming of the first anode, the first base, and the third base of the first thyristor and the forming of the second anode, the second base, and the fourth base of the second thyristor may be useful when a high atomic number, and large mass dopant (e.g., Arsenic) is to be used to form the first cathode and the second cathode, or when the dopants that reduce a minority carrier lifetime are to be implanted along the cathode line. Because such dopants have high atomic number large mass, it may be difficult to implant such dopants to a sufficient depth into the cathode line without damaging intermediate layers, and that form the first anode and the second anode, the first base and the second base, the third base and the fourth base.

In some embodiments, a method is provided for forming a plurality of silicon thyristors. The method may include implanting dopants of a first conductivity type into a trench, where the trench is located between a first silicon thyristor and a second silicon thyristor, and depositing a conductor material region into the trench.

In some aspects, the method further includes a step of depositing an insulating material into the trench prior to forming the conductive material region into the trench. For example, an insulating material such as silicon oxide may be deposited into the trench and etched back, before the conductive material region is deposited into the trench.

In some aspects, the method further includes depositing the insulating material into the trench using a chemical vapor deposition process. For example, silicon oxide may be deposited into the trench using a CVD process.

In some aspects, the method further includes forming a first metal silicide region on a first sidewall of the first silicon thyristor prior to depositing the conductor material region in the trench, and forming a second metal silicide layer on a second sidewall of the second silicon thyristor prior to depositing the conductor material region.

In some aspects, the method further includes implanting dopants that reduce a minority carrier lifetime, the dopants including at least one of iron (Fe), Pt (Platinum), Argon (Ar) or Helium (He).

In some aspects, the method further includes forming a first anode of the first silicon thyristor and a second anode of the second silicon thyristor using a first epitaxial process, and forming a first base of the first silicon thyristor and a second base of the second silicon thyristor using a second epitaxial process.

BRIEF DESCRIPTION OF THE DRAWINGS

The above and other aspects and potential advantages of the present disclosure will be apparent upon consideration of the following detailed description, taken in conjunction with the accompanying drawings, in which like reference characters refer to like parts throughout, and in which.

DETAILED DESCRIPTION

Figure 1:
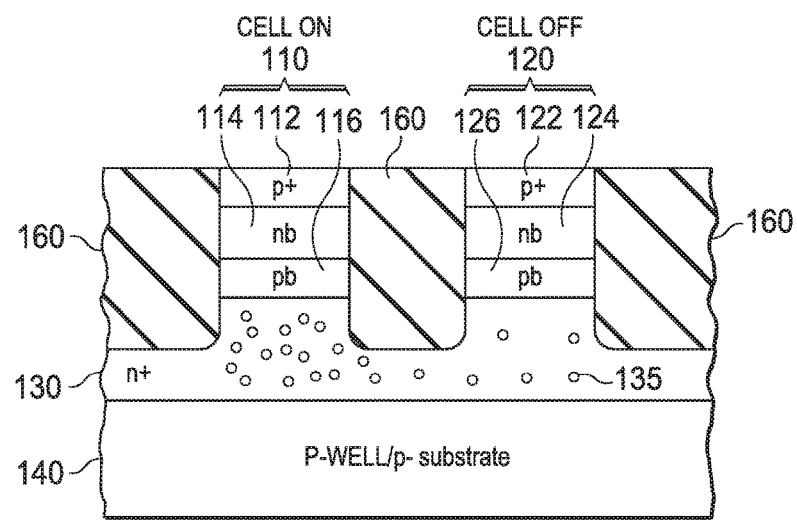
FIG. 1 is a cross-sectional view that illustrates a possible disturb mechanism between neighboring thyristor cells, according to an illustrative implementation.

Vertical thyristors arranged in cross-point arrays offer a promising solution to the challenges described in the background of the disclosure. Advantages of thyristors include the ability to precisely tune operating characteristics (e.g., switching speed, static power consumption, dynamic power consumption, etc.) by tuning the geometry and composition of component layers of each thyristor cell. Vertical thyristors may be arranged as an array of minimum $4F^2$ cells, thereby minimizing cell area and reducing fabrication cost. Vertical thyristors may also be arranged in a stacked configuration to further increase the density of memory cells in a cross-point array.

Vertical thyristors may be arranged in a cross-point array of cells electrically isolated, for example, by trench isolation. As the isolation trenches in thyristor memory arrays become narrower as the thyristors are scaled to smaller dimensions, minority carriers from ON cells can diffuse to neighboring OFF cells. This diffusion of minority carriers from ON cells to OFF cells either causes disturbance of the OFF cells during write operations of neighboring ON cells, causes read operations of neighboring ON cells or neighboring OFF cells, or reduces the retention lifetime of ON cells and neighboring OFF cells. For example, during a write operation of an ON cell, diffusion of minority carriers from the ON cell to a neighboring OFF cell may cause the OFF cell to transition to an ON state. For example, during a read operation of the ON cell, diffusion of minority carriers from the ON cell to the OFF cell may cause the ON cell to transition to an OFF state. Analogously, during a read operation of an OFF cell, diffusion of minority carriers into the OFF cell from the ON cell may cause the OFF cell to transition to an ON state. During retention, an OFF cell may transition to an ON state as minority carriers from a neighboring ON cell diffuse into the OFF cell.

Some solutions to these disturb effects include making the trench isolation deeper and/or wider so that these minority carriers can recombine before they reach any OFF cells. The disadvantages associated with forming deeper trench isolation include the difficulty of etching a deeper high aspect ratio trench and subsequently filling in the deeper trench to form the deeper trench isolation. As an example of a difficulty associated with forming a deeper high aspect ratio trench, ballooning effects may occur during a reactive ion etching (RIE) step that is used to form the high aspect ratio trench. Additionally, the forming of a sidewall passivation layer as part of an RIE step may limit the maximum aspect ratio of a trench. Also, as thyristors are scaled to smaller lateral dimensions, the forming of deeper trenches to separate the thyristors also increases the aspect ratio of semiconductor stacks that make up those thyristors.

This application explores techniques for reducing disturb effects caused by minority carrier diffusion from ON cells to OFF cells across a cathode line connecting the cells by introducing MCLK regions inside the cathode such that these minority carriers recombine before they are able to diffuse into OFF cells. For cell performance considerations, it is also desirable that the introduced MCLK regions do not significantly increase the cathode resistance and ultimately thyristor switching characteristics. MCLK regions may be formed by imbedding a conductor which is physically positioned along the pathway of minority carrier diffusion from ON cells to OFF cells. The conductor, formed from metal or metal silicide, minimally affects cathode resistance and kills minority carriers effectively by promoting their recombination. These MCLK regions provide recombination centers and may also provide a potential profile in order to direct the minority carriers toward the MCLK region. MCLK regions may also be formed by introducing minority carrier lifetime reducers, such as Fe, Pt, He or Ar, in buried cathode regions (e.g., n-type or p-type) and other regions inside the semiconductor bulk that may be in the minority carrier diffusion pathway from ON cells to OFF cells.

FIG. 1 is a cross-sectional view that illustrates a possible disturb mechanism between neighboring thyristor cells, according to an illustrative implementation. The memory array includes a first thyristor 110, and a second thyristor 120 separated by isolation insulator region 160. Isolation insulator region 160 may be composed of Silicon Dioxide or Silicon Oxide (collectively referred to as "oxide") formed by a shallow trench isolation (STI) technique. First thyristor 110 and second thyristor 120 share a common cathode 130, which also serves as a cathode line connecting the first thyristor 110 to the second thyristor 120. In some embodiments, first thyristor 110 and second thyristor 120 are fabricated in a well of a first conductivity type (e.g., ap-well for a pnpn thyristor structure or an n-well for an npnp thyristor structure) on a substrate. As referred to herein, the term "pnpn thyristor structure" shall be used to describe a thyristor structure that is formed from a stack of p-type material, n-type material, p-type material, and then n-type material, from a top surface of the thyristor structure toward a substrate. As referred to herein, the term "npnp thyristor structure" shall be used to describe a thyristor structure that is formed from a stack of n-type material, p-type material, n-type material, and then p-type material, from a top surface of the thyristor structure toward a substrate.

First thyristor 110 may be composed of a plurality of layers including a first semiconductor layer 112 of a first conductivity type (e.g., p-type in a pnpn thyristor structure or n-type in an npnp thyristor structure), a second semiconductor layer 114 of a second conductivity type (e.g., n-type pnpn thyristor structure or p-type in an npnp thyristor structure), a third semiconductor layer 116 of the first conductivity type (e.g., p-type in a pnpn thyristor structure or n-type in an npnp thyristor structure), a fourth semiconductor layer 130 of the second conductivity type (e.g., n-type pnpn thyristor structure or p-type in an npnp thyristor structure), and a fifth layer of the first conductivity type. For example, first thyristor 110 may be composed of a multi-layer structure including a p+ doped layer 112 (e.g., an anode), n− doped layer 114 (e.g., a first base), p− doped layer 116 (e.g., a second base), and n+ doped layer 130 (e.g., a cathode). Second thyristor 120 may be similarly composed of a multi-layer structure. For example, second thyristor 120 may be composed of a multi-layer structure including a p+ doped layer 122 (e.g., an anode), n− doped layer 124 (e.g., a first base), p− doped layer 126 (e.g., a second base), and n+ doped layer 130 (e.g., a cathode). Although each of the p+ doped layers 112 and 122 have been referred to as an anode above, each may also serve as a cathode depending on the electrical operation of each respective thyristor. Although the n+ doped layer 130 has been referred to as a cathode above, it may also serve as an anode depending on the electrical operation of each respective thyristor.

In some embodiments, the terms "n+" and "p+" may respectively refer to heavily doped n-type and p-type semiconductors. For example, an n+ doped layer of silicon may be doped by an n-type dopant such as arsenic, phosphorous, another group 15 element (as understood under the new IUPAC system) or any other suitable n-type dopant, to a concentration that is greater than or equal to approximately 1E18 dopants/cm$^3$. For example, a p+ doped layer of silicon may be doped by p-type dopant such as boron, another group 13 element (as understood under the new IUPAC system) or any other suitable p-type dopant, to a concentration that is greater than or equal to approximately 1E18 dopants/cm$^3$. For example, a heavily doped material may be doped at a concentration where the Boltzmann approximation to Fermi Dirac statistics no longer applies. For example, a heavily doped material may be doped to a degenerately doped condition. In some embodiments, the regions corresponding to the n+ and p+ labels may have a doping concentration that ranges from 5E17 to 5E19 dopants/cm$^3$. In some embodiments, the terms "n−" and "p−" may respectively refer to lightly doped n-type and p-type semiconductors. For example, an n− doped layer of silicon may be doped by an n-type dopant such as arsenic, phosphorous, another group 15 element, or any other suitable n-type dopant, to a concentration equal to or less than approximately 1E15 dopants/cm$^3$. For example, a p− doped layer of silicon may be doped by ap-type dopant such as boron, another group 13 element, or any other suitable p-type dopant, to a concentration equal to or less than approximately 1E15 dopants/cm$^3$. In some embodiments, the regions corresponding to the n− and/or p− labels may be doped to a higher doping concentration. For example, the regions corresponding to the n− and/or p− labels may have a doping concentration ranging from 5E17 to 5E19 dopants/cm$^3$.

Although FIG. 1 is illustrated such that first thyristor 110 is labeled with regions 112, 114, and 116 as separate from regions 122, 124, and 126 of second thyristor 120, it should be understood that regions 112 and 122 may be formed from a same first semiconductor layer, that regions 114 and 124 may be formed from a same second semiconductor layer, and that regions 116 and 126 are formed from a same third semiconductor layer.

Although first thyristor 110 and second thyristor 120 are illustrated as pnpn structures with p+ heavily doped layers 112, 122, and n+ doped cathode layer 130, it should be understood that first thyristor 110 and second thyristor 120 may be implemented as npnp structures, other suitable doping profiles, or any combination of heterojunction structures. For an ON cell (e.g., first thyristor 110) either during turn-on switching or at retention hold, minority holes 135 are injected into the n+ cathode 130 from the p− base 116 and diffuse away from the ON cell (e.g., including first thyristor 110) as they gradually recombine with majority electrons within the cathode 130. Since minority holes have a diffusion length up to micrometer range, even in heavily doped regions (e.g., in cathode 130), some of these holes can diffuse to nearby OFF cells (e.g., second thyristor 120) and cause them to switch into meta stable or ON states. A simplistic solution is to increase the nearest p− base (e.g., p− base 126) junction spacing close to the diffusion length by using a deeper or wider trench isolation. A challenge with using a deeper trench isolation is greater complexity in the fabrication process as discussed above, and a challenge with using a wider trench isolation is a larger cell size which makes scaling difficult.

One solution to reduce disturb effects between thyristor cells is to create a minority carrier lifetime killer (MCLK) region inside a cathode or cathode line such that minority carriers recombine before they can diffuse into nearby OFF cells. As referred to herein, minority carriers shall be understood to refer to a type of charge carrier (e.g., electrons or holes) within a semiconductor material that is less abundant in concentration at a given operating temperature than corresponding majority carriers. For example, in an n-type material, the minority carriers are holes, while the majority carriers are electrons. For example, in a p-type material, the minority carriers are electrons, while the majority carriers are holes. It should also be understood that minority carriers within a first semiconductor region may be considered majority carriers when they cross into a second semiconductor region. For example, in a pn diode, minority carrier electrons within a p-type doped material of the diode become majority carriers when they cross an interface from the p-type doped material of the diode into an n-type doped material of the diode.

As referred to herein, a minority carrier lifetime shall be understood to refer to the average time required for a minority carrier to recombine with a majority carrier within a material. Factors that affect minority carrier lifetime include a concentration of recombination centers within a material. As the number of recombination centers increases, the minority carrier lifetime decreases. A minority carrier diffusion length is related to a minority carrier lifetime by:

$$L=\sqrt{(DT)}$$

where the minority carrier diffusion length (L) is equal to the square root of the product of a diffusivity of the minority carrier (D) and the minority carrier lifetime (T).

As referred to herein, a minority lifetime carrier killer region, an MCLK region, an MCLK material, a minority carrier lifetime attenuator (MCLA) region, an MCLA region, an MCLA material, a reduced minority carrier lifetime (RMCL) region, an RMCL region, or an RMCL material shall be understood to be any material or region that reduces a minority carrier lifetime. For cell performance considerations, it is also desirable that the introduced MCLK region does not significantly increase resistance of a cathode or cathode line and does not affect thyristor switching characteristics. Increased resistance of a cathode or cathode line would reduce speed of read and write operations to a thyristor cell connected to a cathode or cathode line of higher resistance. Increased resistance of the cathode or cathode line may also constrain the maximum dimensions of a cross-point array due to cumulative resistive drops across segments of the cathode. Such cumulative resistive drops reduce read margin from memory cells located near the center of the array. Examples of MCLK materials include metal, metal silicide, chalcogenide, metal oxide, in-situ or ex-situ doped n+ or p+ silicon, or any other suitable compounds or any combination thereof.

In some embodiments of an MCLK region, a conductor is embedded inside a cathode or a cathode line, where the conductor is physically positioned along the pathway of minority carrier diffusion from ON cells to OFF cells. A conductor, such as a metal or metal silicide, meets these requirements because those materials not only have low resistivity (for example, less than 40 μΩ-cm) but also have short minority carrier lifetimes that eliminate minority carriers very effectively. Other suitable materials that may serve as an MCLK material include chalcogenides, metal oxides, or any other suitable material. These MCLK materials can have low electrical resistivity and therefore high electrical conductivity, and can also have a high density of trap states that facilitate recombination, thereby reducing minority carrier lifetime.

Figure 2:
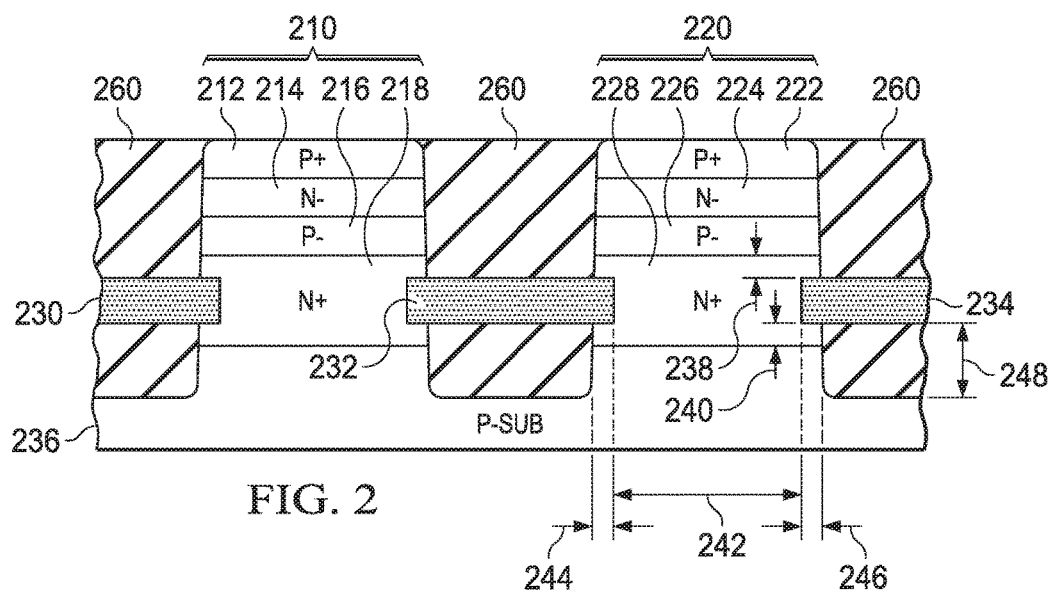
FIG. 2 is a cross-sectional view of a cell array with embedded conductors, according to an illustrative implementation.

FIG. 2 is a cross-sectional view of a cell array with embedded conductors, according to an illustrative implementation. The memory array shown in FIG. 2 includes a first thyristor 210, and a second thyristor 220 separated by isolation insulator region 260. Isolation insulator region 260 may be composed of Silicon Dioxide or Silicon Oxide (collectively referred to as "oxide") formed by a shallow trench isolation (STI) technique. Insulation insulator region 260 may also be referred to as a "trench" 260. First thyristor 210 and second thyristor 220 share a common well substrate 236 onto which they may be fabricated, which may be a p-well in the case of the pnpn thyristor structure shown in FIG. 2, or an n-well for an npnp thyristor structure.

As shown in FIG. 2, first thyristor 210 is connected to second thyristor 220 by an MCLK region 232. The first thyristor 210 is connected to an adjacent thyristor in the memory array (not shown) by additional MCLK region 230. The second thyristor 220 is connected to an adjacent thyristor in the memory array (not shown) by additional MCLK region 234. MCLK regions 230, 232 and 234 may be conductors, composed of a suitable metal or metal silicide. The MCLK regions 230, 232 and 234 may be composed of Tungsten (W). The MCLK regions 230 and 232 are in contact with the cathode layer 218 of the first thyristor 210, while the MCLK regions 232 and 234 are in contact with the cathode region 228 of the second thyristor 220. Thus the alternating MCLK regions (e.g., formed from a conductor or doped semiconductor) and cathode regions (e.g., formed from a semiconductor) connect cathode lines between adjacent thyristors in the thyristor memory array. This conducting line may be the wordline in a cross-point thyristor memory array. Minority carriers from any ON cell must go through an MCLK region completely or partially in order to reach any other thyristor cells along the same cathode line. FIG. 2 shows a generic placement of these MCLK conductors, with additional changes to parameters and dimensions of the embedded MCLK conductors discussed below.

First thyristor 210 may be composed of a plurality of layers including a first semiconductor layer 212 of a first conductivity type (e.g., p-type in a pnpn thyristor structure or n-type in an npnp thyristor structure), a second semiconductor layer 214 of a second conductivity type (e.g., n-type pnpn thyristor structure or p-type in an npnp thyristor structure), a third semiconductor layer 216 of the first conductivity type (e.g., p-type in a pnpn thyristor structure or n-type in an npnp thyristor structure), a fourth semiconductor layer 218 of the second conductivity type (e.g., n-type in a pnpn thyristor structure or p-type in an npnp thyristor structure), and a fifth layer of the first conductivity type. For example, first thyristor 210 may be composed of a multi-layer structure including a p+ doped layer 212 (e.g., an anode), n− doped layer 214 (e.g., a first base), p− doped layer 216 (e.g., a second base), and n+ doped layer 218 (e.g., a cathode). Second thyristor 220 may be similarly composed of a multi-layer structure. For example, second thyristor 220 may be composed of a multi-layer structure including a p+ doped layer 222 (e.g., an anode), n− doped layer 224 (e.g., a first base), p− doped layer 226 (e.g., a second base), and n+ doped layer 228 (e.g., a cathode). Although each of the p+ doped layers 212 and 222 have been referred to as an anode above, each may also serve as a cathode depending on the electrical operation of each respective thyristor. Although the n+ doped layers 218 and 228 have been referred to as a cathodes above, they may also serve as an anode depending on the electrical operation of each respective thyristor.

Although FIG. 2 is illustrated such that first thyristor 210 is labeled with regions 212, 214, 216 and 218 as separate from regions 222, 224, 226 and 218 of second thyristor 220, it should be understood that regions 212 and 222 may be formed from a same first semiconductor layer, that regions 214 and 224 may be formed from a same second semiconductor layer, that regions 216 and 226 are formed from a same third semiconductor layer, and that regions 218 and 229 are formed from the same fourth semiconductor layer. Further illustration of the formation and relation between layers of the first thyristor 210 and second thyristor 220 are discussed in FIG. 9-28B.

The MCLK regions 230, 232 and 234 are conductors embedded in the cathode regions 218 and 228 of the first thyristor 210 and second thyristor 220, respectively. As shown in FIG. 2, there are several parameters which may be adjusted to place the imbedded MCLK or conductor regions 230, 232 and 234 with respect to the trench or insulator region 260, and first and second thyristors 210 and 220. $S_1$ shown at 238 and $S_2$ 240 are vertical distances between p-type regions and the top and bottom (respectively) of the conductors 230, 232 and 234. $S_1$ 238 is a distance to prevent a direct electrical short between the conductor 234 and the p-type base layer 226 as shown in the second thyristor 220. The value of $S_1$ 238 may be greater than or equal to 40 nm if the intermediate material between the p-type base layer 226 and the conductor 234 is n+ silicon. If the intermediate material between the p-type base layer 226 and the conductor 234 is an insulator, then the value of $S_1$ 238 may be greater than or equal to 10 nm. The insulator pad height T 248 is a vertical distance of the conductors 230, 232 and 234 from the bottom or base of the trench regions 260 formed between adjacent thyristors. Insulator pads prevent the conductors 230, 232 and 234 from shorting to the p-well substrate 236 and thus insulates the conductors 230, 232 and 234 from the bottom of the trench. Similarly, the vertical distance $S_2$ 240 prevents the bottom of the conductors 230, 232 and 234 from shorting to the p-well substrate 236. $S_2$ 240 may be greater than or equal to 10 nm. Insulator pad height T may be between 0 nm and 300 nm, depending upon whether the n+ cathodes 228 and 218 extend into the p-well substrate below the trench 260. Depending on the process technology and/or the dimension of the resulting first thyristor 210 or second thyristor 220 semiconductor mesa, the conductor spacing dimension S 242 may be in a range from 0 nm to 200 nm. If the n+ cathodes 228 and 218 extend into the p-well substrate below the trench 260, then S 242 may be as small as possible. As can be appreciated, the intrusion dimension E at 244 and 246 is dependent on the conductor spacing dimension S 242, and may also range from 0 nm to 100 nm.

The dimension parameters $S_1$ 238, $S_2$ 240, T 248, S 242 and E 244 and 246 may be adjusted as desired to alter the pathway through which minority carriers may diffuse from an ON cell to an OFF cell. By extending the conductor regions 230, 232, 234 further into the thyristors 210 and 220 (e.g., reducing the value S 242), one may improve the changes that minority carriers move between the ON cell and the OFF cell via the MCLK conductors 230, 232 and 234, rather than diffusing via a region that may not as effectively promote minority carrier recombination. Variations on the general design as shown in FIG. 2 are described in FIG. 3-7, where these dimension parameters are changed.

Figure 3:
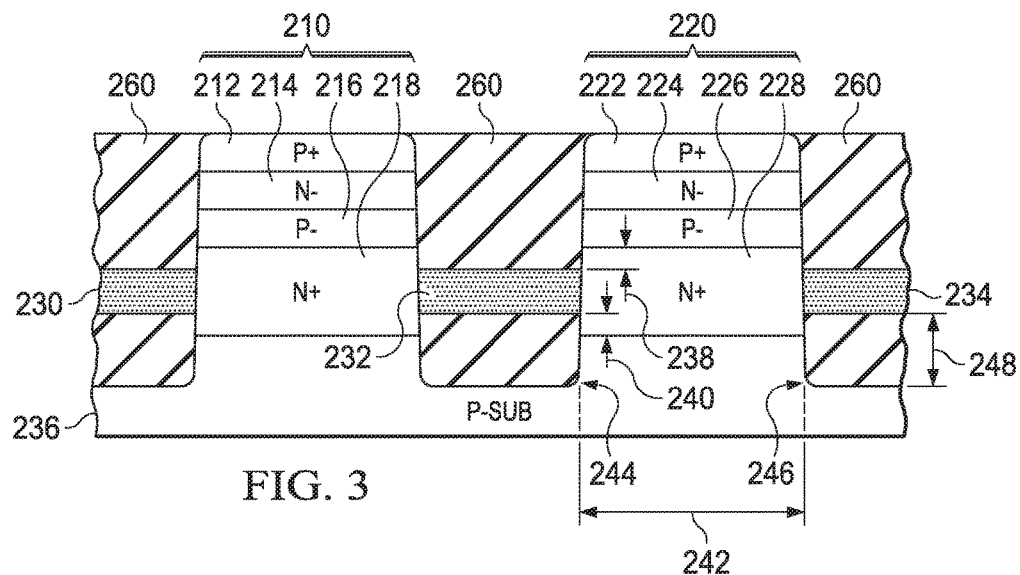
FIG. 3 is a cross-sectional view of a cell array in which embedded conductors are flush with sidewalls of thyristor cells, according to an illustrative implementation.

FIG. 3 is a cross-sectional view of a cell array in which embedded conductors are flush with sidewalls of thyristor cells, according to an illustrative implementation. FIG. 3 corresponds to a variation of the generic architecture shown in FIG. 2 in which the conductor spacing dimension S 242 is equal to the width of the thyristors 210 and 220, and the intrusion dimension E at 244 and 246 is 0. Thus the MCLK conductor regions 230, 232 and 234 are flush with the walls of the first thyristor 210 and second thyristor 220, and make contact with the cathode regions 218 and 228 without intruding into either the first thyristor 210 or the second thyristor 220.

Figure 4:
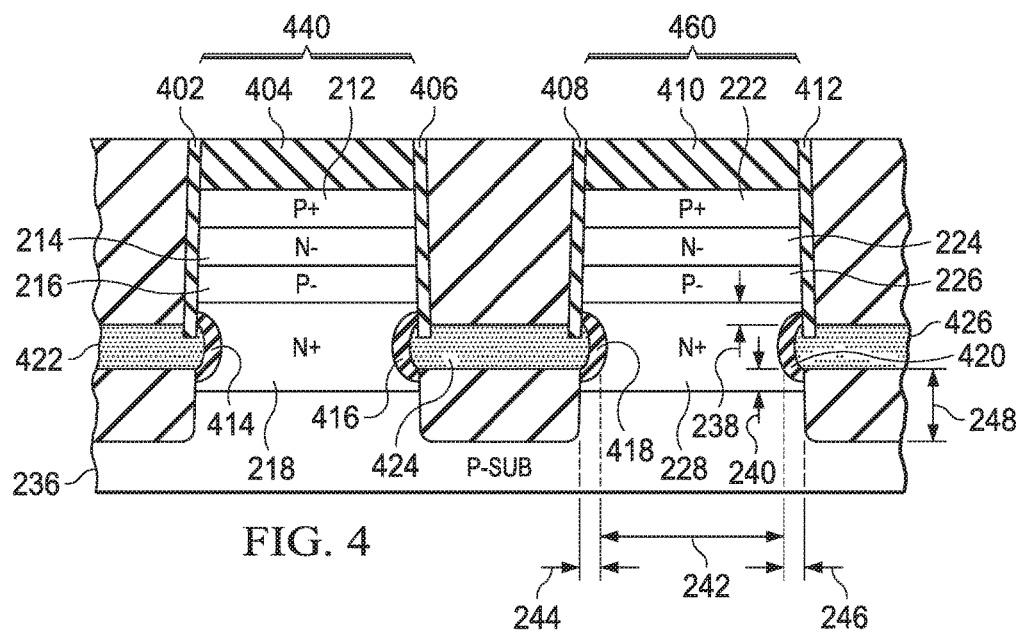
FIG. 4 is a cross-sectional view of a cell array in which embedded conductors extend into the thyristor cells, according to an illustrative implementation.

FIG. 4 is a cross-sectional view of a cell array in which embedded conductors extend into the thyristor cells, according to an illustrative implementation. FIG. 4 shows a variation of the architecture shown in FIG. 2, in which a first thyristor 440 and second thyristor 460 are provided with sidewalls 402, 404, 406, and 408, 410 and 412, respectively. In addition, the MCLK conducting regions 422, 424 and 426 are shown intruding into the first cathode 218 and second cathode 228. Thus FIG. 4 corresponds to a variation of FIG. 2 in which the intrusion dimensions E at 244 and 246 are non-zero.

The sidewalls 402, 404, 406, 408, 410 and 412 may be formed from an insulating material (e.g., silicon nitride, silicon dioxide, or any other suitable insulating material or any combination thereof). To form the sidewalls, a layer of insulating material may be deposited using an isotropic or conformal deposition method. Alternatively to, or in addition before depositing the layer of insulating material, a layer of silicon dioxide may be formed by thermal oxidation of silicon of the first thyristor 440 and second thyristor 460.

The layer of insulating material may be etched using an anisotropic etch to form sidewalls 402, 404, 406, 408, 410 and 412. Further discussion of the formation of the sidewalls is described with reference to FIG. 13.

Additionally, FIG. 4 shows the intruding MCLK conductors 422, 424 and 426 interfacing with the cathode regions 218 and 228 of the first thyristor 440 and second thyristor 460 via conducting interfaces 414, 416, 418 and 420. Conducting interfaces 414, 416, 418 and 420 may be formed from a transition metal, such as Titanium (Ti), Cobalt (Co), or Nickel (Ni), or any other suitable conducting material or combination thereof. For example, conducting interfaces 414, 416, 418, 420 may be a metal silicide formed from a transition metal. Conducting interfaces 414, 416, 418 and 420 may be formed from a metal different from that of the MCLK conductors 422, 424, and 426. Further discussion of the formation of the conducting interfaces 414, 416, 418 and 420 is described with reference to FIG. 15 and FIG. 16.

The intrusion of the conducting interfaces 414, 416, 418 and 420 and MCLK conductors 422, 424 and 426 into the first thyristor cathode 218 and second thyristor cathode 228 may improve the flow of minority carriers from the cathode line formed from 218 and 228 and into MCLK conductors 422, 424 and 426, where they recombine instead of diffusing to other regions in the thyristor memory array where they may disrupt write functions or retention of the thyristor cells.

Figure 5:
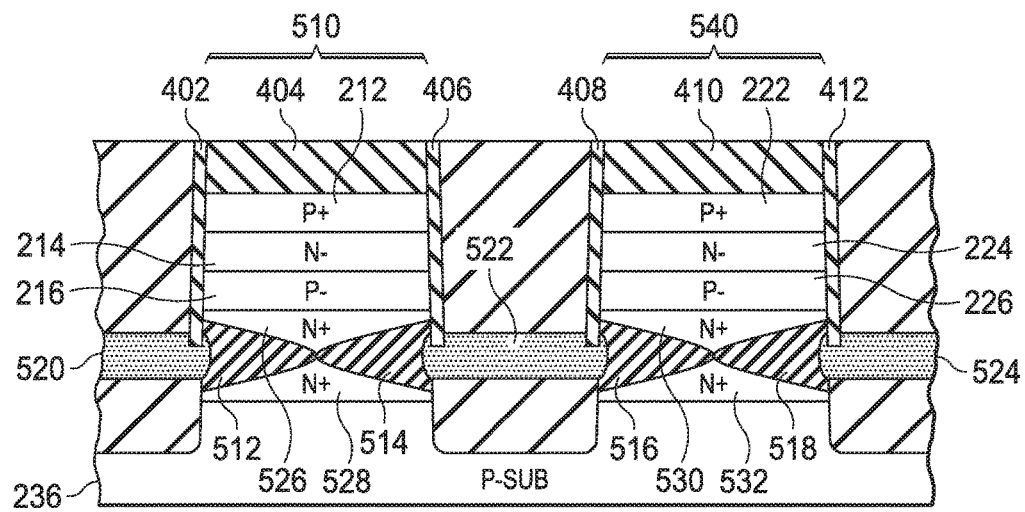
FIG. 5 is a cross-sectional view of a cell array in which embedded conductors are merged underneath the thyristor cells, according to an illustrative implementation.

FIG. 5 is a cross-sectional view of a cell array in which embedded conductors are physically connected or merged underneath the thyristor cells, according to an illustrative implementation. FIG. 5 corresponds to a variation of FIG. 4 in which the conducting interfaces 414, 416, 418 and 420 have been merged beneath each thyristor. Thus FIG. 5 shows a first thyristor 510 and second thyristor 540 with the same layers 212, 216, 218, and 222, 224, 226 respectively, as described with reference to FIG. 2. However, as shown in FIG. 5, the sidewalls of cathodes 526 and 528 of the first thyristor 510, and the sidewalls of cathodes 530 and 532 of the second thyristor 540 have been partially etched, and the conducting interface 512 has been formed (e.g., by silicidation through a first half of the first cathode from a first sidewall) and the conducting interface 514 has been formed (e.g, by silicidation through a second half of the second cathode from a second sidewall) to merge together, while conducting interface 516 has merged with conducting interface 518 in a similar fashion.

The merged conducting interfaces 512 and 514, and merged interfaces 516 and 518 may be more optimal and easily produced when the width of the first thyristor 510 and the width of the second thyristor 540 are thin, such as for widths from 3 to 50 nm. The conducting interfaces 512 and 514 may be formed from a transition metal, such as Titanium (Ti), Cobalt (Co), or Nickel (Ni), or any other suitable conducting material or combination thereof. These interfacing materials may consist of multiple layers for purpose of adhesion and diffusion blocking, examples including Titanium and Titanium Nitride. Conducting interfaces 512, 514, 516 and 518 may be formed from a metal different from that of the MCLK conductors 520, 522, and 524. Further discussion of the formation of the conducting interfaces 512, 514, 516 and 518 is described with reference to FIG. 15 and FIG. 16.

Figure 6:
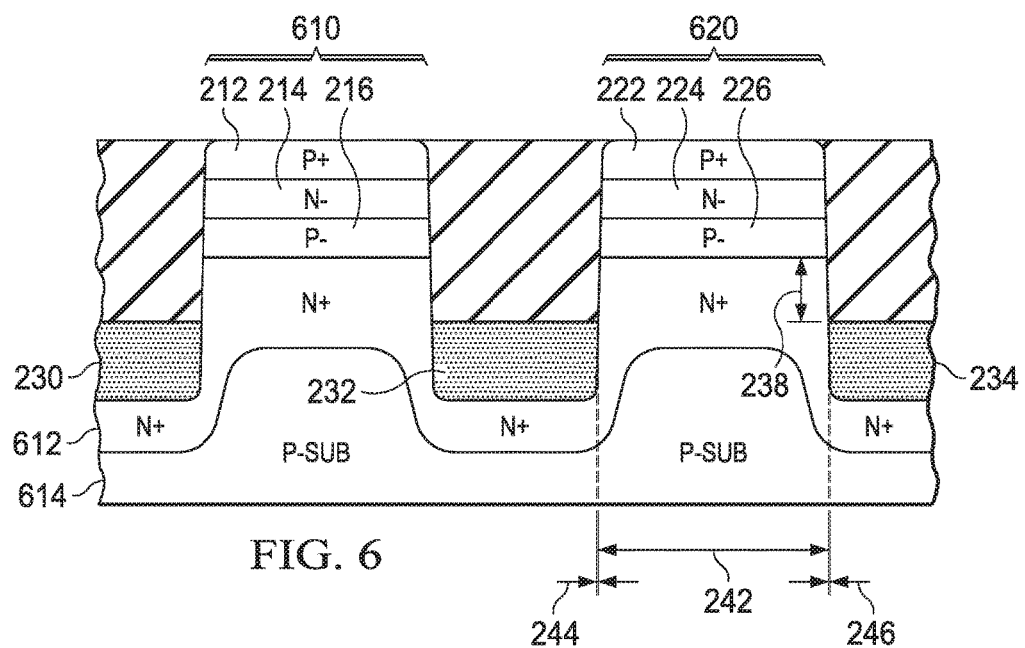
FIG. 6 is a cross-sectional view of a cell array in which a minority carrier lifetime killer (MCLK) region is formed at a base of a trench with a higher surface area in contact with a doped semiconductor region (e.g., an n+ region) connecting cathodes of thyristor cells, according to an illustrative implementation.

FIG. 6 is a cross-sectional view of a cell array in which a minority carrier lifetime killer (MCLK) region is formed at the base of trenches between and next to first thyristor 610 and second thyristor 620, according to an illustrative implementation. As shown in FIG. 6, the layers 212, 214, and 216 of the first thyristor 610 are the same as described in FIG. 2, while layers 222, 224 and 226 of the second thyristor 620 are the same as described in FIG. 2. However, the cathode layer 612 is electrically connected to the first thyristor 610 and second thyristor 620. MCLK conductors 230, 232, and 234 are shown in FIG. 6 as formed at the base of trenches between and first thyristor 610 and second thyristor 620 and next to said thyristors. Because the MCLK conductors are at the base of the trenches, and because the profile of cathode layer 612 wraps around the MCLK conductors, a larger surface area of the MCLK conductors are in contact with the cathode layer 612, and a larger portion of current through cathode layer 612 is directed along the interface between cathode layer 612 and the MCLK conductors, resulting in a higher proportion of minority carriers being captured and recombined along the interface. In some embodiments, the MCLK conductor material may be selected such that they form a potential well for minority carriers, in order to draw minority carriers towards the interface between the MCLK conductor and cathode layer 612. For example, when the minority carriers are holes in an n+ doped silicon cathode layer, the MCLK conductor may be selected to be a metal with a work function that is greater in magnitude relative to a vacuum reference level than a Fermi level of the n+ doped silicon cathode layer, such that the profile of the band diagram of the n+ doped silicon cathode layer near the interface with the MCLK region attracts minority carrier holes towards the interface to recombine. The MCLK conductor material may be selected in the implementations shown in FIG. 2-7.

The p-well substrate 614 may be etched to form trenches proximate to the first thyristor 610 and second thyristor 620, and between said first thyristor 610 and said second thyristor 620. An n-type dopant, such as arsenic or phosphorous may be implanted into the trenches, and then subsequently annealed to form a continuous doped region as the n+ doped n-type cathode layer 612. The n-type cathode layer 612 may be formed from an n+ doped layer, as shown in FIG. 6, for a pnpn thyristor. Layer 612 may also be formed from a p+ doped layer for an npnp thyristor. In this second embodiment, the substrate layer 614 would be an n-well substrate.

Figure 7:
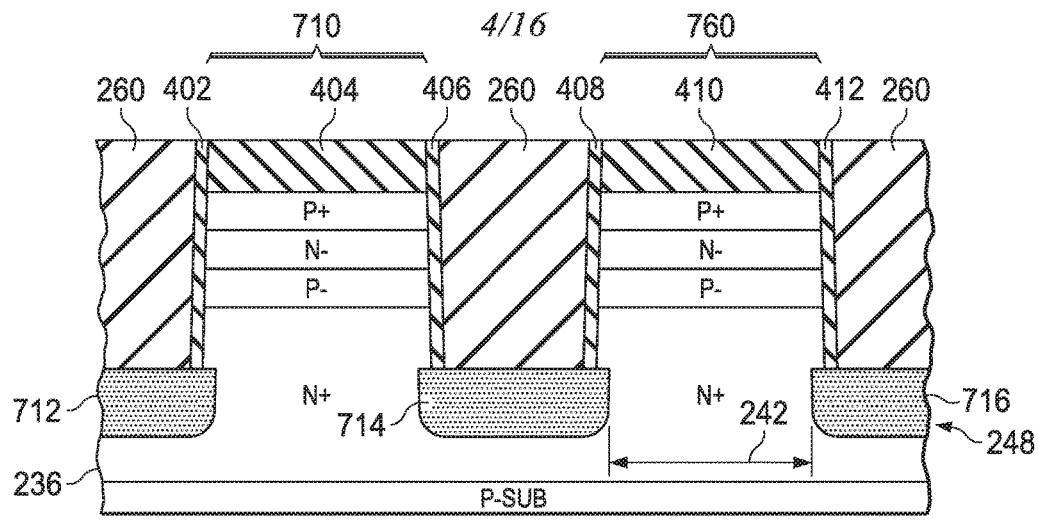
FIG. 7 is a cross-sectional view of a cell array with silicon sidewalls, in which embedded conductors are formed at the bottom of trenches, according to an illustrative implementation.
Figure 9:
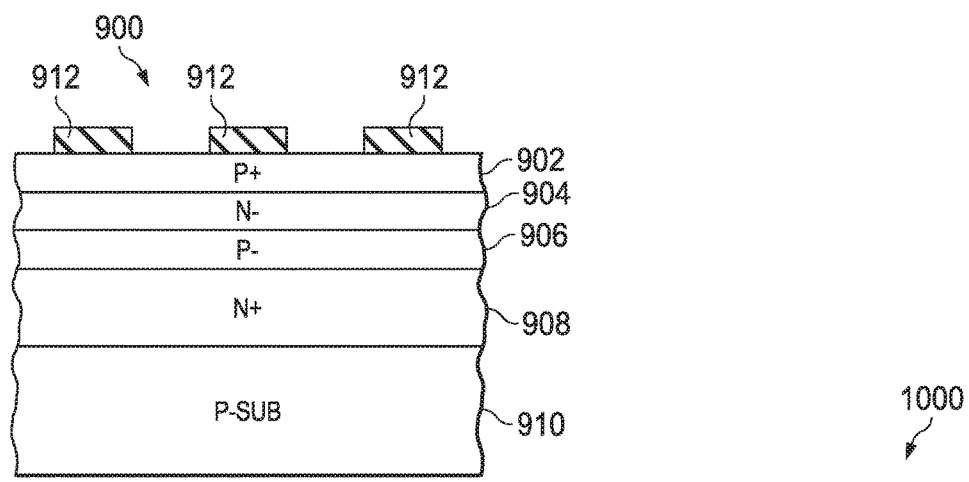
FIGS. 9-18 are cross-sectional views as part of a process for manufacturing an array of thyristor memory cells in accordance with some embodiments of the present disclosure.

FIG. 7 is a cross-sectional view of a cell array with silicon sidewalls, in which embedded conductors are formed in the bottom of trenches, according to an illustrative implementation. FIG. 7 corresponds to a variation of FIG. 2 in which the insulator pad height T at 248 is 0, such that the MCLK conductors 712, 714 and 716 are in contact with the bottom of the trenches 260. Thus three sides of the MCLK conductors 712, 714 and 716 shown in the cross-section of FIG. 7 are in contact with the n-type cathode region 236, while the fourth side of the MCLK conductors 712, 714 and 716 (corresponding to the top face of the MCLK conductors) are in contact with the insulation layer in the trenches 260 and the sidewalls 402, 406, 408 and 412. Thus the MCLK conductors 712, 714 and 716 are in the path of minority carriers that may diffuse between thyristors. For example, MCLK conductor 714 is in the path of diffusion of minority carriers from the first thyristor 710 to the second thyristor 760. Minority carriers diffusing along this path may interact or be captured by MCLK region 714.

The MCLK conductors 712, 714 and 716 are shown as protruding into the n-type cathode semiconductor, however it is also possible for the MCLK conductors 712, 714 and 716 to be flush with the sidewalls of the first thyristor 710 and second thyristor 760, such that the dimension 242 approximately the full width of the thyristors 710 and 760 at their respective cathodes. The height of the MCLK conductors 712, 714 and 716 may be adjusted such that the height between the top of the MCLK conductors 712, 714 and 716 and the top of the cathode layer (e.g., at an interface with a lower base of a first thyristor 710 and/or at an interface with a lower base of a second thyristor 720) may be optimized.

An advantage of the architecture described in FIG. 7 in which the MCLK conductors 712, 714, 716 are in contact with the n-type cathode at three sides, is that the MCLK conductors 712, 714 and 716 may be formed within the trench, instead of a partial oxide at the base of the trench. The formation of the MCLK conductors on the base of the trench avoids the additional steps of forming an insulating layer (e.g., forming oxide by a CVD process) within the trench and etching back the insulating layer (e.g., etching back the oxide), thereby resulting in a simpler and lower cost fabrication process than used to fabricate the architecture described in FIGS. 2-6, in which an additional etch step is needed to form an insulation layer between the MCLK conductors 712, 714, 716 and the p-well substrate 236. The MCLK conductors may be formed by a CVD process. Because the MCLK regions are not required to conduct current between the first thyristor 710 and second thyristor 720, an ohmic contact does not need to be formed between the MCLK region and the cathode line.

Figure 8:
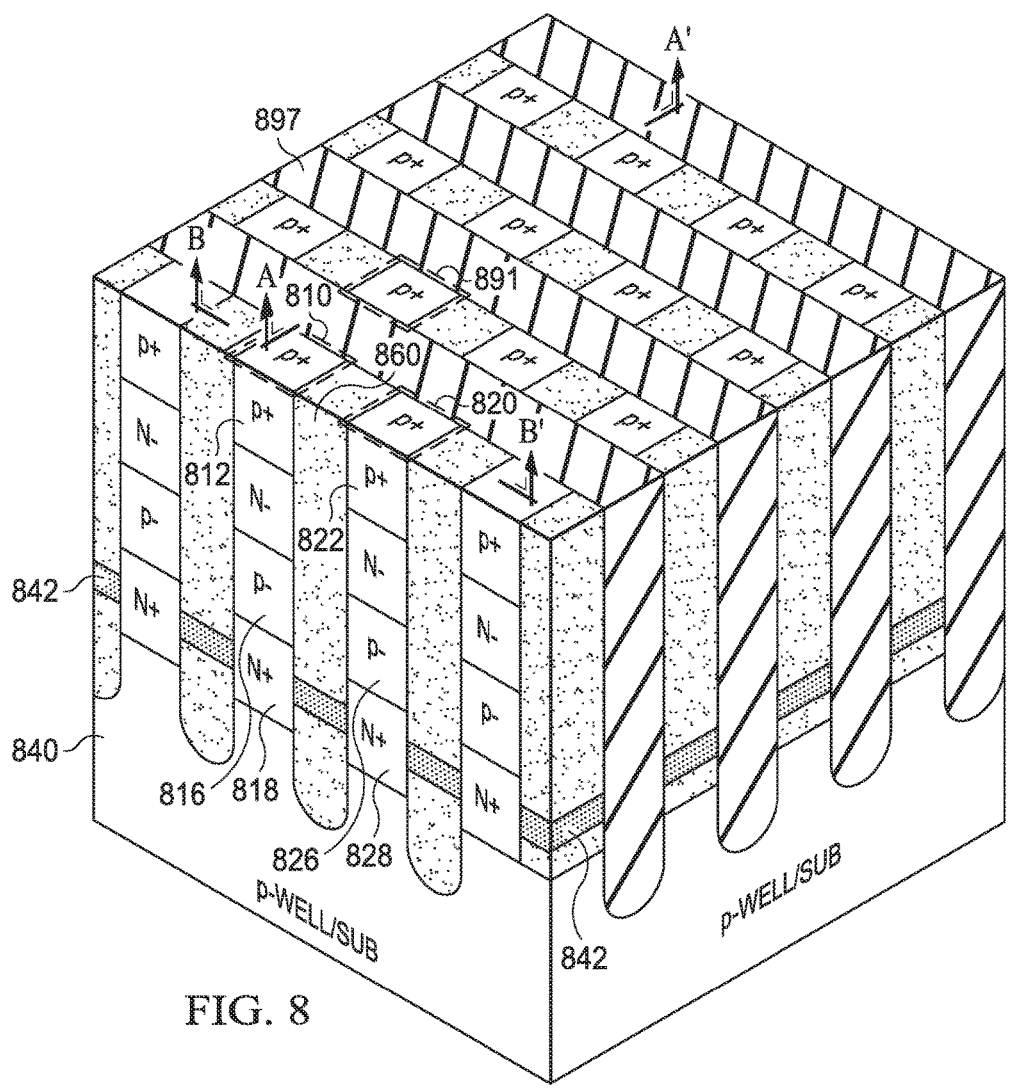
FIG. 8 is a 4×4 cell array that includes MCLK regions, according to an illustrative implementation.

FIG. 8 is a 4×4 cell array that includes MCLK regions, according to an illustrative implementation. FIG. 8 is shown here as a 4×4 thyristor cell array analogous to the cross-section of FIG. 3. In this cell design, a cathode line shown at 818 and 828 is separated from another cathode line by a trench isolation 897 that extends deeper than the cathode lines at 818 and 828. The cathodes lines (e.g., 818 and 828) are oriented in the direction labeled B-B'. Anode access lines (not shown) connect to top p+ regions in directions orthogonal to the cathode lines (e.g., 818 and 828). For example, an anode access line connects to the top p+ regions of thyristors 810 and 891 in the direction labeled A-A'.

Between each cathode along a cathode line is included an MCLK region, as shown at 842. This MCLK region may be a conductor region, as discussed with reference to FIG. 2-6. Because minority carriers generated by an ON cell (e.g., 810) flow into a MCLK region at 842 and recombine therein, fewer minority carriers diffuse to a neighboring OFF cell (e.g., 820 located on the same primary cathode line in the direction labeled B-B'). For example, fewer minority carriers can diffuse from cathode 818 of cell 810 to cathode 828 and base 826 of cell 820. Accordingly, because fewer minority carriers diffuse to the neighboring OFF cell, cell disturbance effects on the neighboring OFF cell are reduced.

The MCLK regions 842 between cathodes depicted in FIG. 8 can be conductor regions composed of any suitable MCLK material. Although the MCLK regions are depicted as aligned to an edge of a trench isolation (e.g., 897) in FIG. 8, each MCLK region 842 can encroach into the n+ cathode regions, as shown in analogous cross-sections in FIG. 2, FIG. 4, FIG. 5, and FIG. 6. Additionally, although the MCLK region 842 is shown with an insulating region between the bottom of the trenches, it is also possible to place the MCLK region 842 at the bottom of the trench, as shown for example in the cross-section of FIG. 7. Although the MCLK region 842 is shown in FIG. 8 as being directly in contact with the n+ cathode regions, it is also possible to include a conducting interface, such as those shown, for example, in FIG. 4 and FIG. 5. Additionally, it is possible for the n+ regions shown at 818 and 828 to extend into the p-well substrate below the trench, as shown in FIG. 6. Although FIG. 8 has been described in the context of pnpn thyristor memory cells, it should be understood that the concepts described therein could apply to npnp thyristor cells, or any other types of cells in cross-point memories.

FIG. 9-18 are cross-sectional views as part of a process for manufacturing an array of thyristor memory cells in accordance with some embodiments of the present disclosure. The process shown in FIG. 9-18 starts with the cross-sectional structure 900, which includes a mask layer 912 (e.g., composed of silicon nitride, or any other suitable hard mask material for silicon etch). Mask layer 912 may also be composed of a pad oxide layer (not shown), which itself may be composed of silicon dioxide or any other suitable buffer layer. Structure 900 includes a p+ layer 902, n– layer 904, p– layer 906, n+ layer 908, which may all be fabricated on a p– substrate 910. Each of the layers 902, 904, 906, 908 and 910 may be composed of silicon, silicon germanium, or any other suitable semiconductor.

Figure 10:
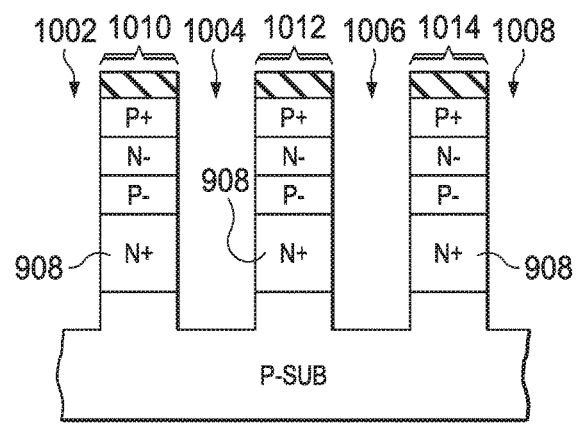

FIG. 10 shows the structure 900 after an etch process has been performed to etch trenches 1002, 1004, 1006 and 1008. The etch produces thyristor stacks 1010, 1012, and 1014. The resulting structure 1000 has a set of cathode 908, in which the cathodes of each thyristor 1010, 1012, and 1014 are separated by the trenches 1004 and 1006. The etching may be any suitable dry etching process (e.g., RIE, plasma etching, sputtering) or any wet etching process. FIG. 10 illustrates the thyristor array along the cathode line (e.g., in the direction labeled B-B' in FIG. 2).

Figure 11:
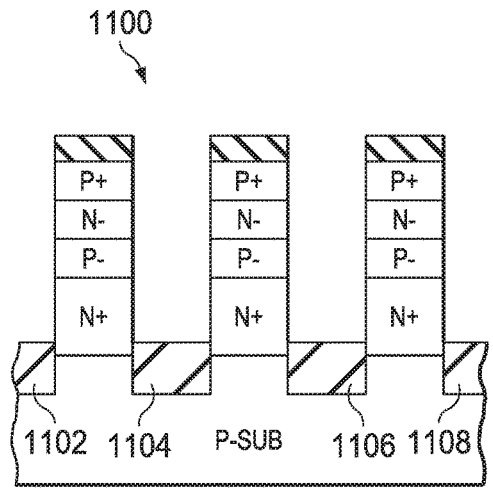

FIG. 11 shows a structure 1100 formed after the deposition of an insulating layer in the trenches, followed by a planarization and etch back to produce the layers shown at 1102, 1104, 1106 and 1108. Alternatively, to produce, for example, the cross-section shown in FIG. 7, the layers 1102, 1104, 1106 and 1108 may be MCLK conductors instead of insulating material, such that the MCLK conductor 712 corresponds to the 1102, MCLK conductor 714 corresponds to 1104, and MCLK conductor 716 corresponds to 1106, as shown in FIG. 7. To produce the cross-section shown in FIG. 7, the trenches between the thyristors may be etched to a shallower depth such that the n+ cathodes are connected by a continuous cathode line as illustrated in FIG. 7. To produce the cross-section shown in FIG. 7, the initial n+ layer may be formed at a greater depth, such that the n+ cathodes of the thyristors are connected by a continuous cathode line as illustrated in FIG. 7. To produce a variant of FIG. 7, an n-type implant may be performed into the trenches surrounding the thyristors in order to form a conducting n-doped region below the trenches that connect the n+ cathodes. To produce the cross-sections shown in FIG. 2-6, however, the first layer deposited in the base of the trenches will be an insulating layer. This insulating layer may be an oxide, such as silicon nitride, silicon dioxide, or any other suitable insulating material or any combination thereof.

Figure 12:
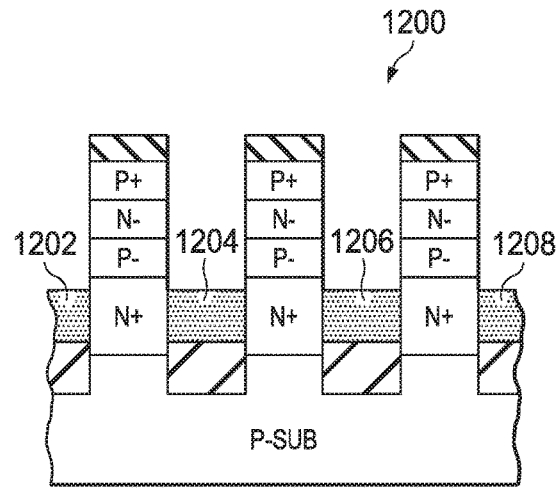

FIG. 12 shows structure 1200 formed after the deposition of a sacrificial layer, such as carbon or any other suitable sacrificial layer, on top of the insulating layer, as shown at 1202, 1204, 1206 and 1208. To form the cross-sections shown at FIG. 4 and FIG. 5, which include insulating sidewalls, the layers 1202, 1204 and 1206 will be a sacrificial layer. However, in order to produce the cross-sections shown in FIG. 3, layers 1202, 1204, 1206 and 1208 may in fact be MCLK conductors, such that the MCLK conductor 230 corresponds to layer 1202, MCLK conductor 232 corresponds to layer 1204, and MCLK conductor 234 corresponds to layer 1206.

Figure 13:
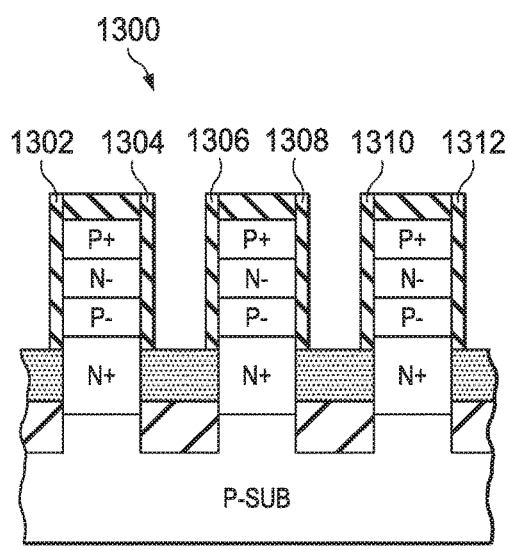

FIG. 13 shows structure 1300 following an insulator deposition and etch to form sidewalls 1302, 1304, 1306, 1308, 1310 and 1312 along the walls of each thyristor. The insulator may be silicon nitride, silicon dioxide, or any other suitable insulating material or any combination thereof. As is apparent, this process may be skipped for any architectures that do not include insulating sidewalls.

Figure 14:
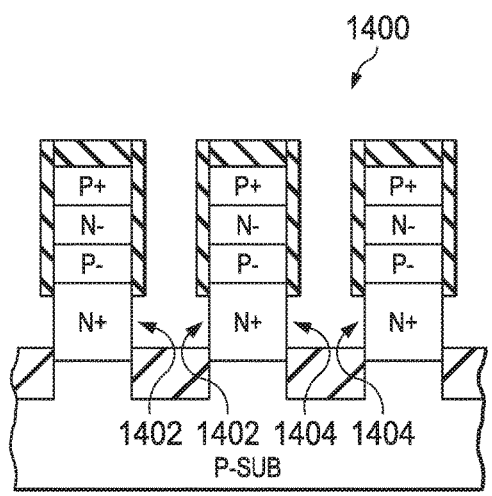
Figure 15:
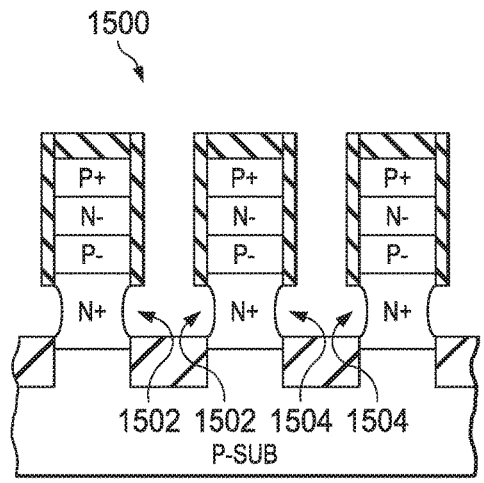

FIG. 14 shows the removal of the sacrificial layer deposited in FIG. 12, which produces a gap between the sidewall and the bottom insulating layer, exposing the cathode in the trench. This may be done with an ashing method, or any other suitable process to remove the sacrificial layers 1202, 1204, 1206 and 1028 to produce structure 1400. FIG. 15 shows the additional etching into the side of the cathodes, as shown at 1500, which may produce the desired thickness of the cathode layer of the thyristor, and which may form cavities in the sidewalls and/or undercuts into the cathodes. Structure 1500 may be used to produce, for example, the cross-section shown in FIG. 4 and FIG. 5, in which the MCLK conductors intrude into the thyristor cathode.

Figure 16:
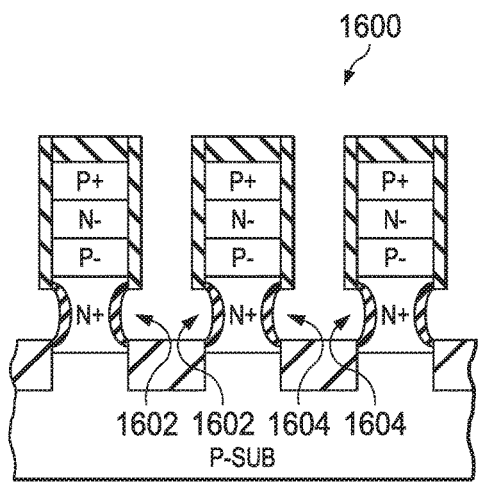

FIG. 16 shows a structure 1600 following the deposition and anneal of a transition metal, such as Ti, Co, or Ni, or any other suitable transition metal, to form silicide interfaces shown at 1602 and 1604. A wet etch process may be used to remove the un-silicided metal. Structure 1600 may be used to produce cross-sections shown in FIG. 4 and FIG. 5. To produce FIG. 5, in which the conducting interfaces 512 and 514 merge, and in which the conducting interfaces 516 and 518 merge, the silicide interfaces shown at 1602 and 1604 may be formed into the cathodes until they merge.

Figure 17:
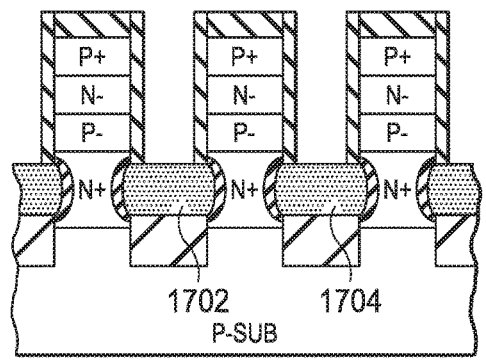

FIG. 17 shows the structure 1700 after the deposition of a metal, such as Tungsten, or any other material suitable for forming an MCLK conductor as described herein. Following the deposition of the metal, an etch back is performed to produce the trench above the MCLK conductor layers, as shown at 1702 and 1704.

Figure 18:
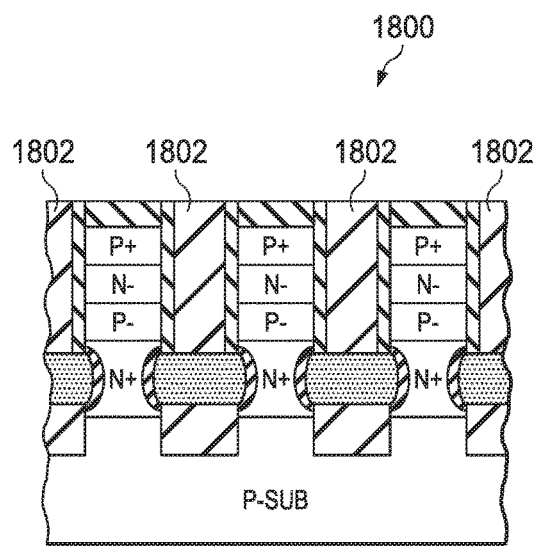

FIG. 18 shows the final insulator fill and planarization, as insulation material is deposited in the trenches as shown at 1802. As can be appreciated, the structure 1800 is similar to that described in cross-section FIG. 4.

Figure 19A:
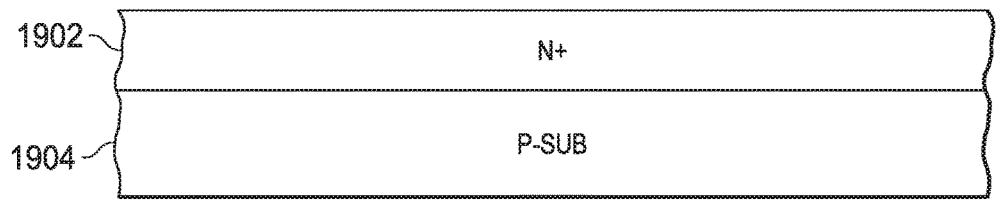
FIGS. 19A-26B are cross-sectional views as part of another process for manufacturing an array of thyristor memory cells in accordance with some embodiments of the present disclosure.
Figure 19B:
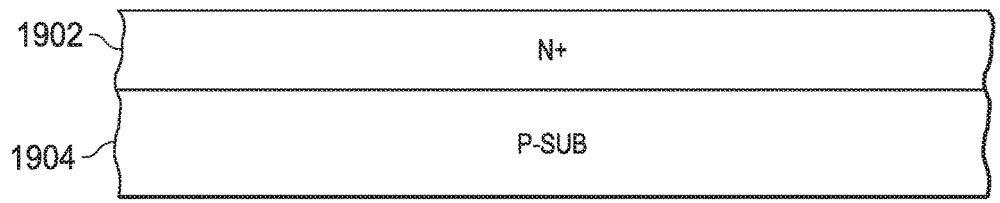

FIGS. 19A-26B are cross-sectional views as part of another process for manufacturing an array of thyristor memory cells in accordance with some embodiments of the present disclosure. FIG. 19A shows a one face of a structure used to form a thyristor memory array cell, while FIG. 19B shows a second face of the structure used to form the thyristor memory array cell. FIG. 19A shows the anode direction, as indicated by the direction A-A' as shown in FIG. 8, while FIG. 19B shows the cathode direction, as indicated by the direction B-B' as shown in FIG. 8. Thus FIG. 19A may be a cross-section of a bit-line in a thyristor memory array, while FIG. 19B may be a cross-section of a word-line in a thyristor memory array. FIG. 19A and FIG. 19B show a starting structure for producing the MCLK region architectures described herein. FIGS. 19A-26B may show an alternative process for forming the MCLK region architectures from the process shown in FIGS. 9-18. FIGS. 19A and 19B show starting structures composed of ap-type substrate 1904, onto which a layer of n+ heavily doped regions are formed as shown at 1902. The layer 1902 may be formed on the substrate layer 1904 by ion implant. FIGS. 19A-26B show a process for forming pnpn type thyristors, however as can be appreciated, npnp type thyristors may also be formed. For npnp type thyristors, the substrate layer 1904 may be a n-type well, while the first deposited layer 1902 would be an p+ doped region. The structures of FIGS. 19A and 19B may be useful in case dopants having a high atomic number or high mass (e.g., arsenic) are to be used to form cathode lines (e.g., from layer 1902), or if dopants that reduce a minority carrier lifetime (e.g., which may be dopants having a high atomic number or a high mass such as iron (Fe), platinum (Pt), or other suitable dopants) are to be implanted along a cathode line. The implantation of these dopants into layer 1902 (e.g., used to form cathode lines) before forming subsequent higher layers can reduce damage to higher layers.

Figure 20A:
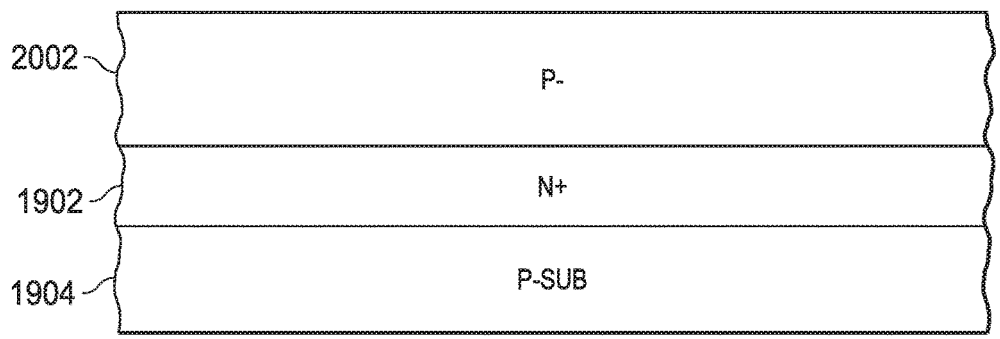
Figure 20B:
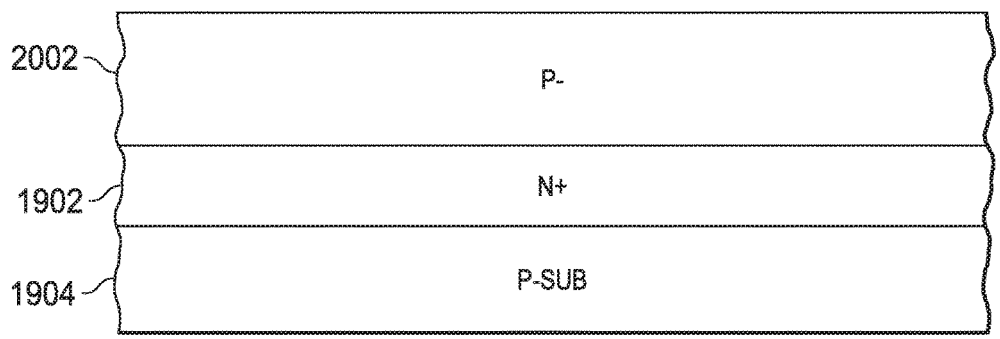

FIG. 20A shows an anode direction cross-section of a thyristor memory array, while FIG. 20B shows a cathode direction cross-section of a thyristor memory array. At 20A and 20B, a layer 2002 has been added to the structures shown in FIGS. 19A and 19B. Layer 2002 may be ap-type epitaxial silicon. Layer 2002 may be grown by in-situ doping with boron.

Figure 21A:
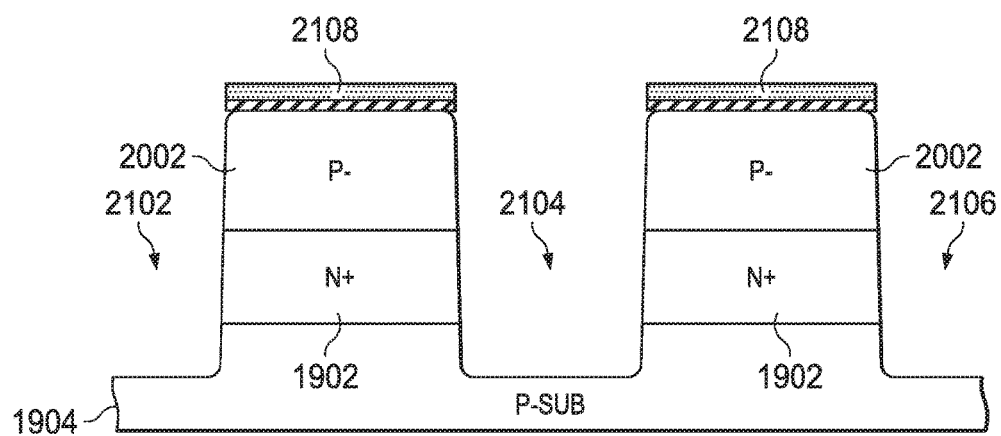
Figure 21B:
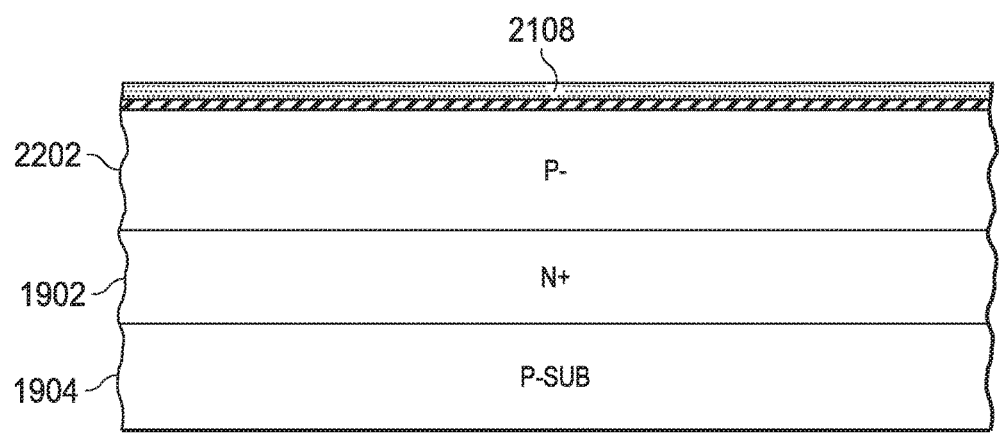

FIG. 21A shows an anode direction cross-section of a thyristor memory array, while FIG. 21B shows the cathode direction cross-section of a thyristor memory array. At 21A, a mask layer shown at 2108, which may consist of silicon nitride or a silicon oxide/nitride composite, is deposited on the structures shown in FIGS. 20A and 20B. The mask layer 2108 may be deposited by CVD on the entire wafer surface. Trench masking steps are then used to define parallel photoresist and hard mask (HM) stripes along the bit-line or anode direction (shown at FIG. 21A). Silicon trenches ranging from 5 nm to 700 nm are etched in the bit-line direction, producing the trenches shown at 2102, 2104 and 2106. In the word-line or cathode, the direction shown at 21B may not change from FIG. 20B to FIG. 21B other than the deposition of the mask layer 2108. The silicon trenches may be etched by reactive ion etch (RIE).

Figure 22A:
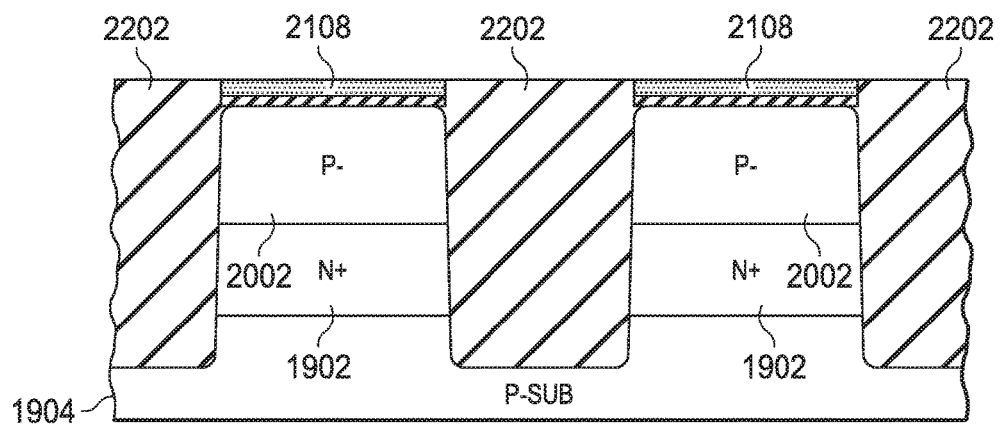
Figure 22B:
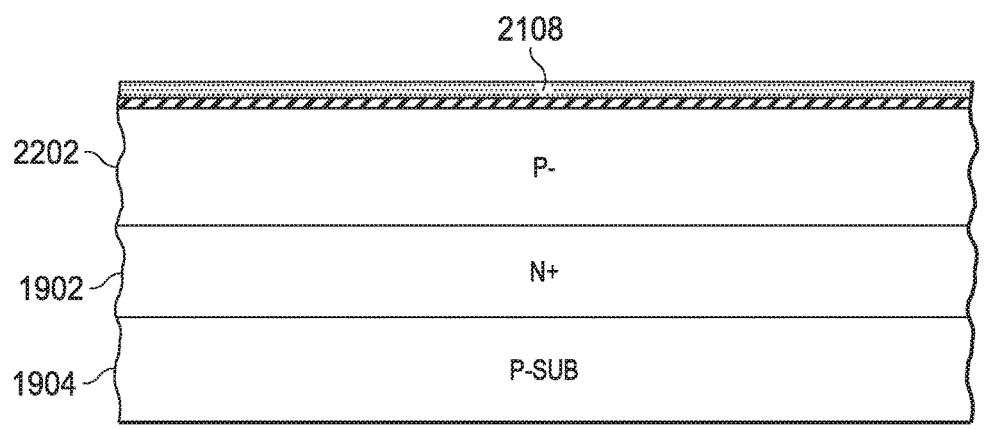

FIG. 22A shows the bit-line or anode direction cross-section of a thyristor memory array, while FIG. 22B shows the cathode or word-line direction cross-section of a thyristor memory array. The trenches produced in FIG. 21A are filled in FIG. 22A with an insulating material as shown at 2202. 2202 may be an oxide, and may be filled by a flowable CVD process for a void-free fill or any other suitable process for filling the trenches 2102, 2104 and 2106 as shown in FIG. 21. Chemical mechanical polishing (CMP) may be used to planarize the oxide fill layer 2202 down to the mask layer 2108.

Figure 23A:
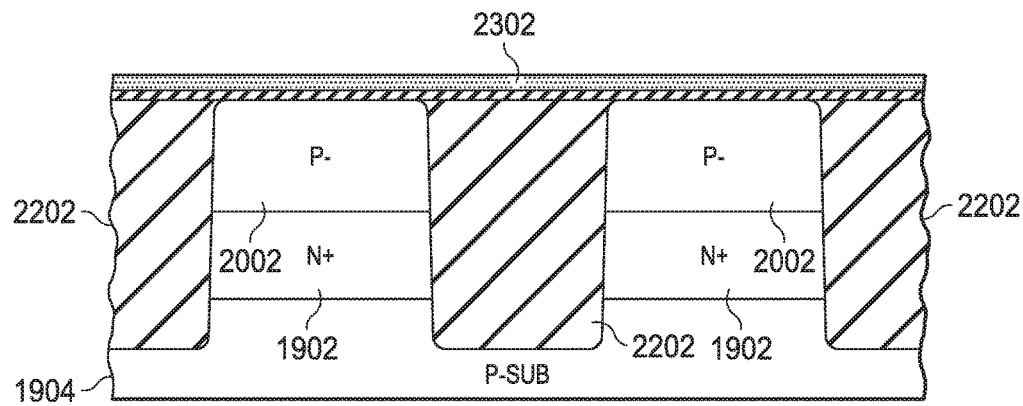
Figure 23B:
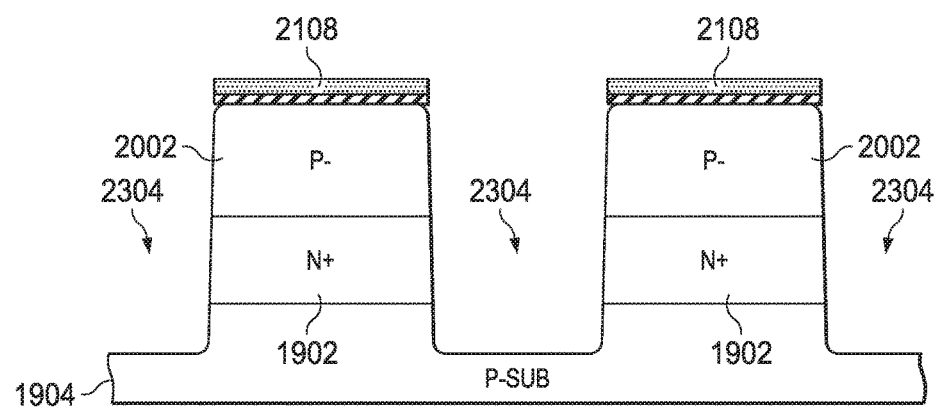

FIG. 23A shows the bit-line or anode direction cross-section of a thyristor memory array, while FIG. 23B shows the cathode or word-line direction cross-section of a thyristor memory array. A mask layer 2302 may be deposited above the insulating layers 2202 as shown in FIG. 23A. Silicon trench holes may be etched using any suitable etching process to produce the trenches 2304 as shown in FIG. 23B. To produce insulating sidewalls, such as those discussed for example with reference to FIGS. 4, 5, and 7, the structure shown in FIG. 23B may be deposited with insulating sidewalls.

Figure 24A:
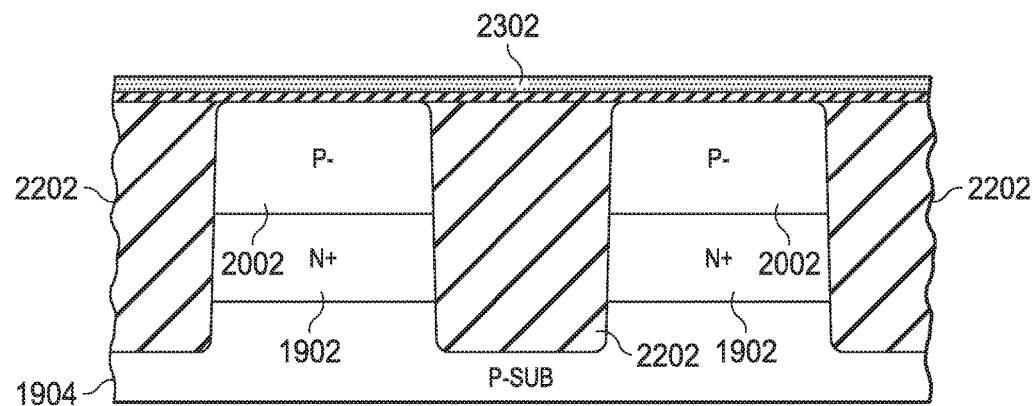
Figure 24B:
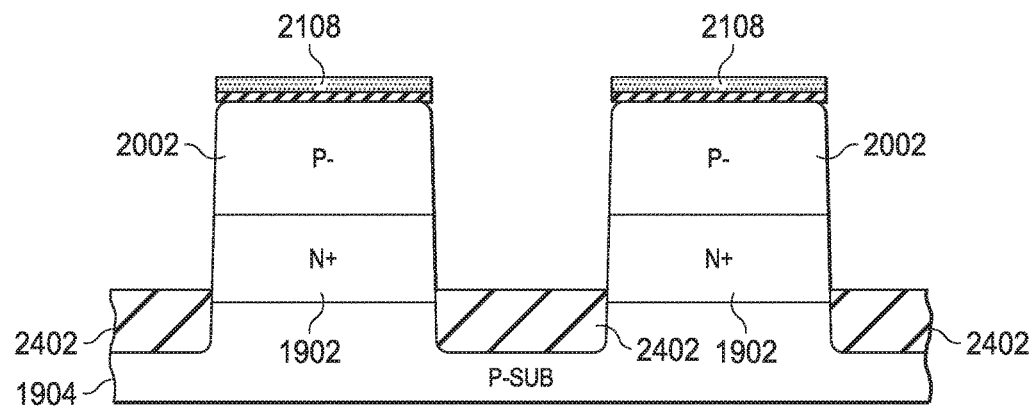

FIG. 24A shows the bit-line or anode direction cross-section of a thyristor memory array, while FIG. 24B shows the cathode or word-line direction cross-section of a thyristor memory array. An insulation layer 2402 may be deposited at the bottom of the trenches produced in FIG. 23B. The insulation layer 2402 may be flowable oxide. The insulation layer 2402 may be etched back after depositing so that the insulation layer remaining at the bottom of the trenches is of a suitable thickness. This thickness may be the same trench height dimension T 248 as shown in FIG. 2. For architectures in which the MCLK conductors are formed in the bottom of the trenches, such as in FIG. 7, the layer 2402 may be composed of an MCLK conducting material, such as Tungsten or another suitable transition metal, rather than an insulating material. If this option is chosen, a self-aligned n-type implant is performed first before the MCLK material is deposited such that there is a continuous n-type material connecting the cathodes.

Figure 25A:
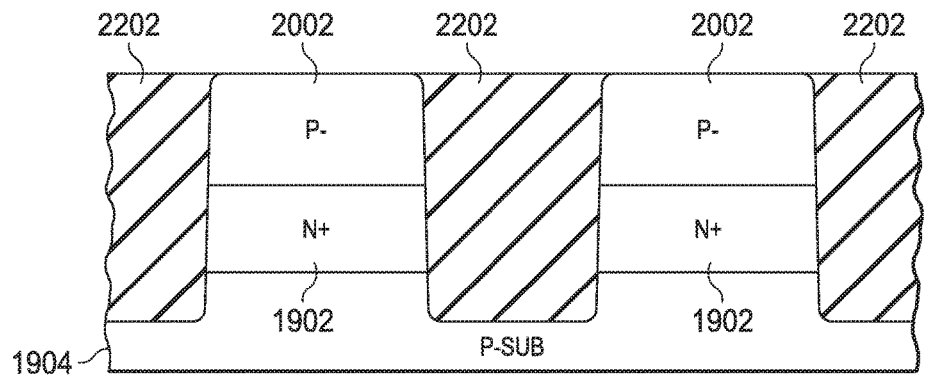
Figure 25B:
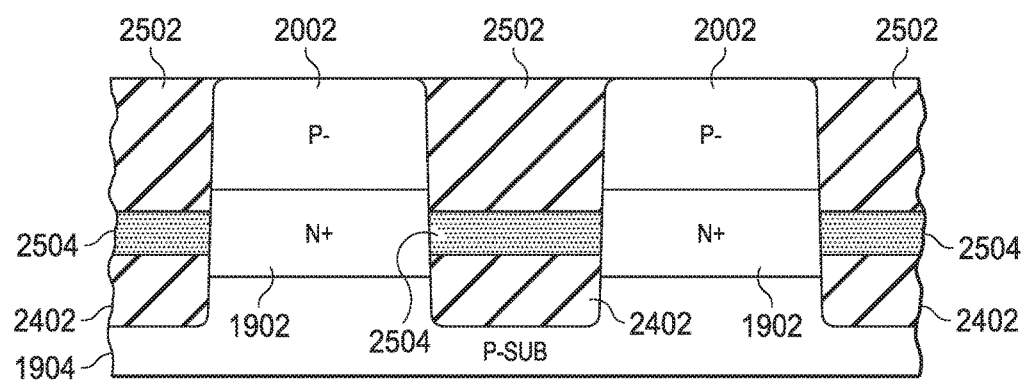

FIG. 25A shows the bit-line or anode direction cross-section of a thyristor memory array, while FIG. 25B shows the cathode or word-line direction cross-section of a thyristor memory array. MCLK conductors are formed at 2504 by depositing a suitable MCLK conducting material, such as Tungsten or another suitable transition metal, onto the insulation layer deposited in FIG. 24B. The MCLK conductors 2504 may then be etched back after being deposited. Following the etch back of the MCLK conductors 2504, the remaining area in the trench is filled with a suitable insulating material, as shown at 2502. The mask layers 2302 as shown in FIG. 24A and mask layer 2108 as shown in FIG. 24B are then removed.

Figure 26A:
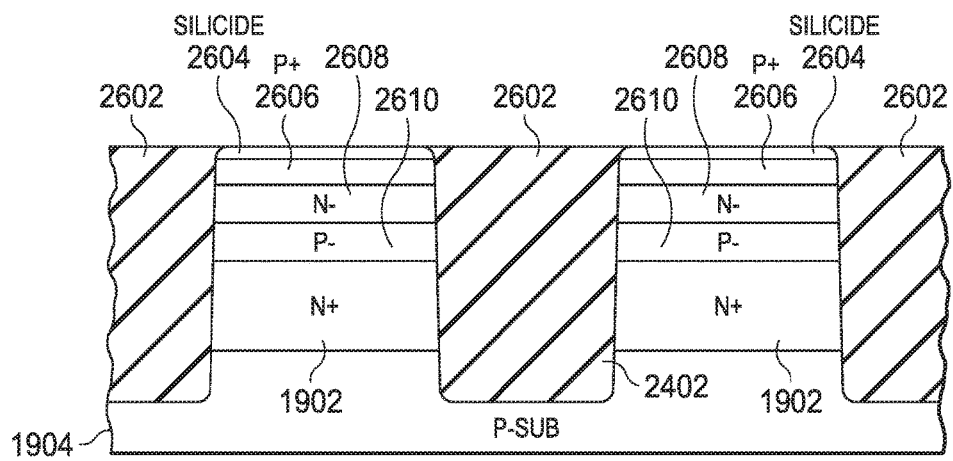
Figure 26B:
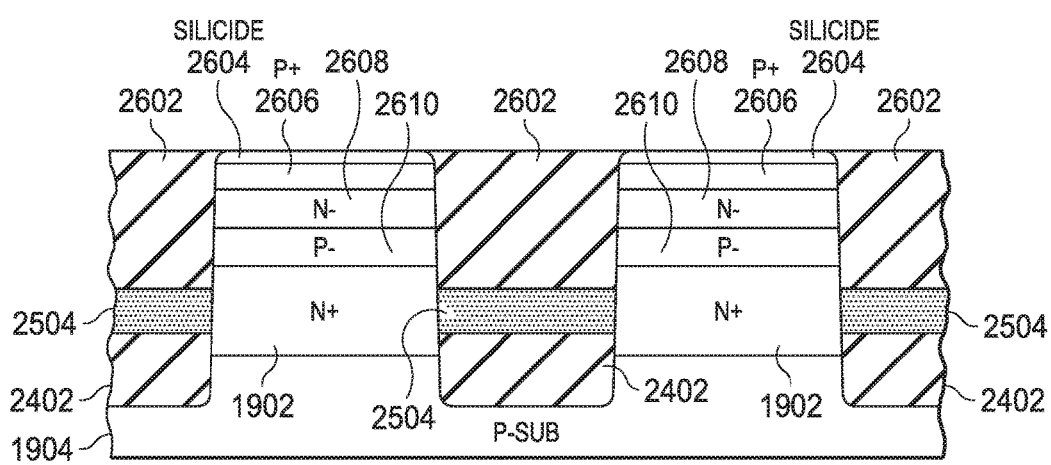

FIG. 26A shows the bit-line or anode direction cross-section of a thyristor memory array, while FIG. 26B shows the cathode or word-line direction cross-section of a thyristor memory array. As shown in FIGS. 26A and 26B, additional layers to fully form the pnpn thyristor are here deposited. The height of the p– base layer, as shown in FIG. 20A-25B as layer 2002 may be adjusted to produce the final desired layer thickness at 2610. The n– base layer 2608 and the p+ anode layer 2606 are then formed by, for example, ion implantation and bitline contact at 2604 by deposition and etch. Alternatively, either or both regions of 2608 and 2606 can also be formed by selective epitaxy and in-situ doping. In this case, insulation layer 2602 may be added to the insulation layers 2202 and 2502 as shown in FIGS. 25A and 25B, respectively, to fully insulate the trench separating each thyristor in the thyristor memory array.

Figure 27A:
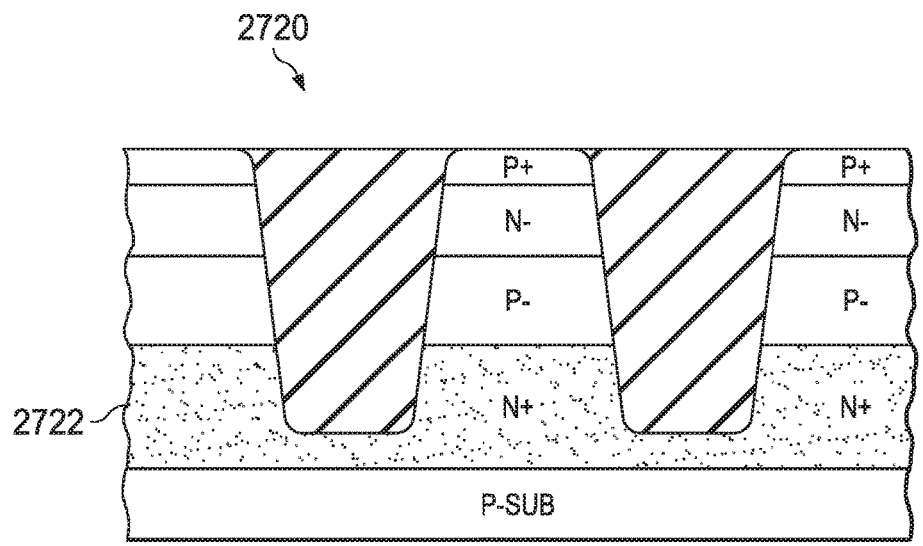
FIGS. 27A and 27B are cross-sectional views of a process for manufacturing an array of thyristor memory cells with doped MCLK regions, according to an illustrative implementation.
Figure 27B:
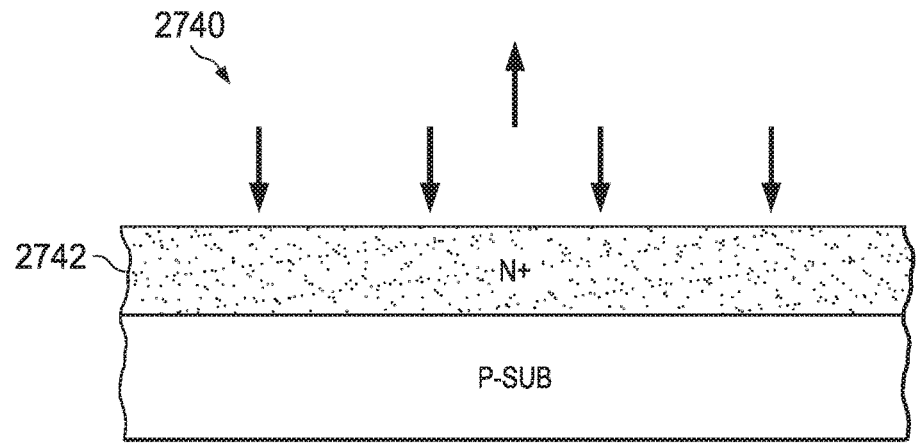

FIGS. 27A and 27B are cross-sectional views of a process for manufacturing an array of thyristor memory cells with doped MCLK regions, according to an illustrative implementation. The structure 2720 as shown in FIG. 27A may be produced from substrate and n+ layers as shown in structure 2740 in 27B. The cathode layer 2722 contains uniformly distributed and implanted minority carrier lifetime reducers, such as Fe, Pt, He or Ar. Thus, in the pnpn thyristors shown in 2720, the cathode layer 2722 acts as an MCLK region, as the implanted dopants reduce minority carrier lifetimes, thus preventing them from diffusing between ON cells and OFF cells within the thyristor memory array. The uniform distribution of minority carrier lifetime reducers, as shown in 2720, may be produced by implanting the n+ layer of an intermediate structure 2740, that is then etched and deposited to produce the thyristor array of structure 2720. The thyristors shown in FIG. 27A are pnpn thyristors, however for npnp thyristors, the layer in which the minority carrier lifetime reduces are implanted, shown at 2742, may be a p+ layer deposited on an n-well substrate.

Figure 28A:
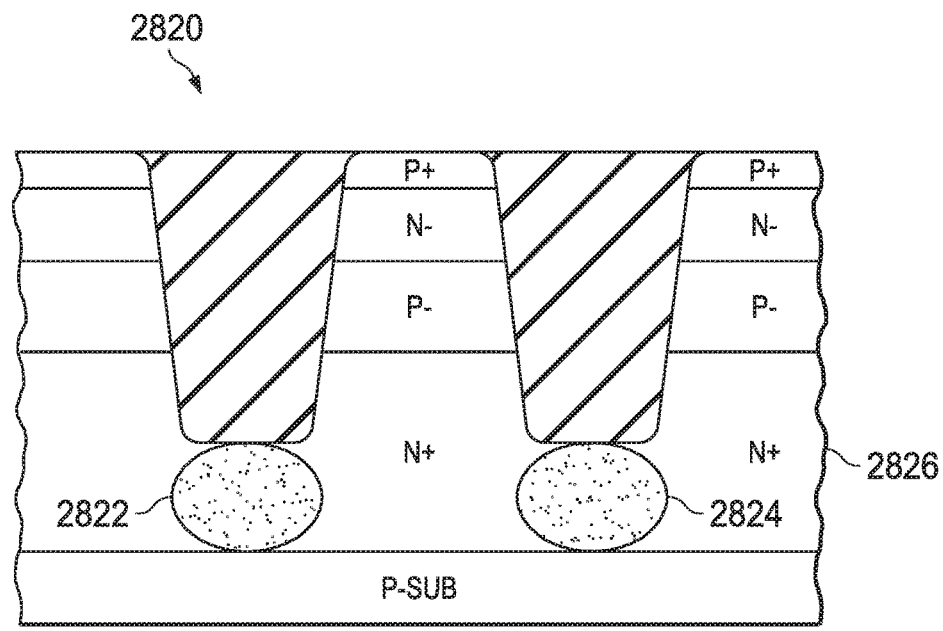
FIGS. 28A and 28B are cross-sectional views of another process for manufacturing an array of thyristor memory cells with doped MCLK regions, according to an illustrative implementation.
Figure 28B:
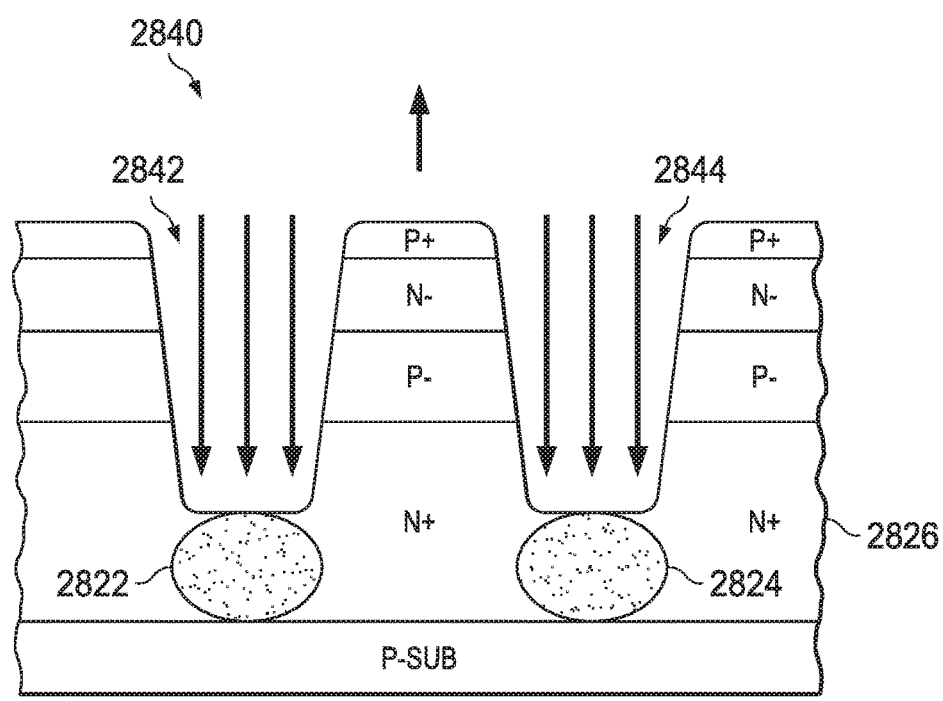

FIGS. 28A and 28B are cross-sectional views of another process for manufacturing an array of thyristor memory cells with doped MCLK regions, according to an illustrative implementation. The structure 2820 as shown in FIG. 28A may be produced from the structure 2840 as shown in FIG. 28B. The cathode layer 2826 contains deposits of minority carrier lifetime reduces at 2822 and 2824, which are concentrated below the bottoms of the trenches in the thyristor array as shown in FIG. 28A. The deposits of minority carrier lifetime reducers at 2822 and 2824 may be formed by depositing through the n+ layer 2826 in the trenches, as shown in FIG. 28B at 2824 and 2844. Thus, after the thyristor stacks have been etched with trenches, the minority carrier lifetime reduces are deposited through the base of the trenches into the cathode layer 2826. This produces clusters or concentrations of these minority carrier lifetime reducers at the base of the trenches in the thyristor array. These clusters form MCLK regions 2822 and 2824, which prevent the diffusion of minority carriers from ON cells to OFF cells within the thyristor memory array. Suitable minority carrier lifetime reducers may be Fe, Pt, He or Ar, or any other dopant that may promote recombination of minority carriers. The thyristors shown in FIG. 28A are pnpn thyristors, however for npnp thyristors, the layer into which the minority carrier lifetime reducers are implanted, shown at 2842 and 2844, may be a p+ layer deposited on an n-well substrate.

This description has been presented for the purposes of illustration. It is not intended to be exhaustive or to limit the invention to the precise form described, and many modifications and variations are possible in light of the teaching above. The figures are not drawn to scale and are for illustrative purposes. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. A cross-point memory array including silicon thyristors interconnected by anode lines and cathode lines in a cross-point arrangement, the array comprising:
    a first silicon thyristor comprising a first cathode;
    a second silicon thyristor comprising a second cathode;
    a trench formed between the first silicon thyristor and the second silicon thyristor; and
    a conductor material region formed in the trench and located along a minority carrier diffusion pathway between the first silicon thyristor and the second silicon thyristor, wherein the conductor material region connects the first cathode of the first silicon thyristor and the second cathode of the second silicon thyristor forming a cathode line in the cross-point memory array.

2. The cross-point memory array of claim 1, wherein the conductor material region contacts a surface of the first cathode without extending into the first cathode and contacts a surface of the second cathode without extending into the second cathode.

3. The cross-point memory array of claim 1, wherein the conductor material region is electrically coupled to the first cathode through a first metal silicide region, and is electrically coupled to the second cathode through a second metal silicide region.

4. The cross-point memory array of claim 1, wherein the conductor material region is separated from a base of the trench by a layer of insulating material.

5. The cross-point memory array of claim 1, wherein the conductor material region is formed by a chemical vapor deposition process.

6. The cross-point memory array of claim 5, wherein the conductor material region comprises Tungsten.

* * * * *